US009607685B2

(12) United States Patent
Liaw

(10) Patent No.: US 9,607,685 B2
(45) Date of Patent: Mar. 28, 2017

(54) MEMORY ARRAY WITH STRAP CELLS

(71) Applicant: TAIWAN SEMICONDUCTOR MANUFACTURING COMPANY, LTD., Hsinchu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/813,185

(22) Filed: Jul. 30, 2015

(65) Prior Publication Data
US 2017/0032835 A1    Feb. 2, 2017

(51) Int. Cl.
G11C 5/02 (2006.01)
G11C 11/419 (2006.01)

(52) U.S. Cl.
CPC ................. *G11C 11/419* (2013.01)

(58) Field of Classification Search
CPC .................................................. G11C 11/419
USPC .......................... 365/154, 156, 51
See application file for complete search history.

(56) References Cited

U.S. PATENT DOCUMENTS

| 6,870,375 | B2 * | 3/2005 | Sarma | G01R 27/2605 324/658 |
| 7,675,124 | B2 * | 3/2010 | Liaw | G11C 11/412 257/390 |
| 7,969,811 | B2 * | 6/2011 | Nii | G11C 7/18 365/230.03 |
| 7,990,760 | B2 * | 8/2011 | Fukano | G11C 11/412 365/156 |
| 8,605,523 | B2 | 12/2013 | Tao et al. | |
| 8,630,132 | B2 | 1/2014 | Cheng et al. | |
| 8,760,948 | B2 | 6/2014 | Tao et al. | |
| 8,908,421 | B2 | 12/2014 | Liaw | |
| 2014/0032871 | A1 | 1/2014 | Hsu et al. | |
| 2014/0153321 | A1 | 6/2014 | Liaw | |
| 2014/0153345 | A1 | 6/2014 | Kim et al. | |
| 2014/0177352 | A1 | 6/2014 | Lum | |
| 2014/0233330 | A1 | 8/2014 | Ko et al. | |
| 2014/0241077 | A1 | 8/2014 | Katoch et al. | |
| 2014/0269114 | A1 | 9/2014 | Yang et al. | |

* cited by examiner

*Primary Examiner* — Tha-O H Bui
(74) *Attorney, Agent, or Firm* — Slater Matsil, LLP

(57) ABSTRACT

A memory array comprises a plurality of memory cells arranged in columns and rows. The memory array also comprises a plurality of first-type strap cells arranged in a row, wherein each first-type strap cell comprises a first-type well strap structure. The memory array further comprises a plurality of second-type strap cells arranged in a row. Each second-type strap cell comprises a second-type well strap structure. Each column of memory cells is bracketed by at least one first-type strap cell of the plurality of first-type strap cells or at least one second-type strap cell of the plurality of second-type strap cells.

20 Claims, 19 Drawing Sheets

MEMORY ARRAY WITH STRAP CELLS

BACKGROUND

Static random access memory ("SRAM") arrays are commonly used for data storage in integrated circuit devices. Recent advances in fin field effect transistor ("finFET") technology have made advanced SRAM cells using finFET transistors possible. SRAM array performance is often layout dependent. For example, a position at which an SRAM cell lies in the SRAM array sometimes causes an inner cell of an SRAM array to perform differently compared to an edge cell of the SRAM array. The difference in performance is often caused by a discontinuous cell layout structure of the edge cells. Some SRAM arrays include dummy cells that have P-well and N-well strapping structures to help make overall SRAM performance more uniform. Dummy cells that include strapping structures are sometimes called strap cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
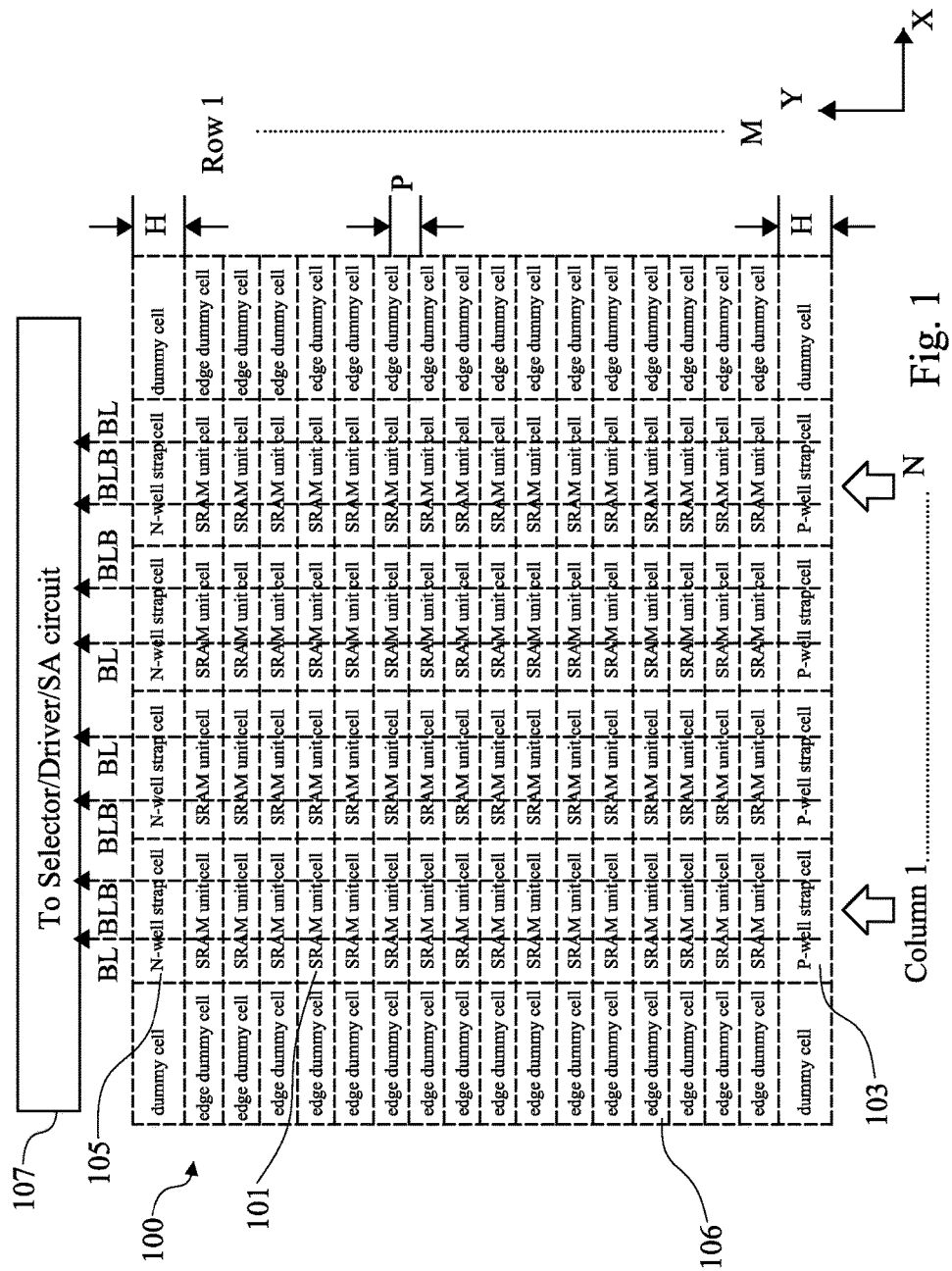
FIG. 1 is a plan view of a static random access memory (SRAM) array, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Strap cells help to make overall SRAM array performance more uniform among the inner cells and the edge cells of the SRAM array. Strap cells that are included in some SRAM arrays include both N-well strap structures that make an electrical connection between a voltage line and an N-well region in a substrate, and P-well strap structures that make an electrical connection between a voltage line and a P-well region in a substrate. These connections are used to help with uniform charge distribution throughout the SRAM array. As SRAM arrays continue to shrink in physical size to 10 nanometer technologies and beyond, conventional strap cells consume an increased percentage of the SRAM array area, which reduces the efficiency of the SRAM array. As such, the embodiments discussed below introduce SRAM arrays that include strap cells that consume a lesser amount of the SRAM array compared to strap cells which include both N-well strap structures and P-well strap structures adjacent to each other.

The embodiments discussed herein help to reduce an area of an SRAM array size by about 1.3% to about 18.5% compared to a comparable SRAM array that includes strap cells having both P-well strap structures and N-well strap structures adjacent to one another. For example, the embodiments discussed herein describe SRAM arrays that comprise strap cells that include only one of N-well strap structures or P-well strap structures; or N-well strap structures spaced from P-well strap structures.

Additionally, because, in some embodiments, the discussed strap cells include only one of an N-well strap structure or a P-well strap structure, the cell heights of the strap cells are lower than the cell heights of strap cells that include both P-well strap structures and N-well strap structures. An SRAM array that includes strap cells that have lower cell heights have bit lines that have overall shorter lengths. A length of a bit line has an effect on the capacitance in the bit line. For example, capacitance increases as the length of the bit line increases. Similarly, capacitance decreases as the length of the bit line decreases. SRAM array performance improves with a decrease in capacitance of a bit line.

FIG. 1 is a plan view of an SRAM array 100 in accordance with one or more embodiments. SRAM array 100 comprises a plurality of SRAM cells 101 arranged in columns and rows. SRAM array 100 also includes a plurality of first-type strap cells 103 and a plurality of second-type strap cells 105. SRAM array 100 optionally includes column edge/dummy cells 106. The SRAM cells 101 are configured to be electrically connected to a sense amplifier 107.

The columns of SRAM cells 101 are arranged in a first direction Y. SRAM array 100 includes N columns, where N is a positive integer. The rows of SRAM cells 101 are arranged in a second direction X. The second direction X is different than the first direction Y. SRAM array include M rows, where M is a positive integer.

Each SRAM cell 101 comprises a bit line portion BL extending in the first direction Y, a complementary bit line portion BLB extending in the first direction Y, a word line portion WL (not shown) extending in the second direction X, a connection to a first voltage line Vss (not shown), and a connection to second voltage line Vdd (not shown). The bit line portion BL of each SRAM cell 101 is coupled with the bit line portions BL of adjacent SRAM cells 101 in a same column of the SRAM array 100 to form a bit line across SRAM array 100. The complementary bit line portion BLB of each SRAM cell 101 is coupled with the complementary bit line portions BLB of the adjacent SRAM cells 101 in the same column of the SRAM array 100 to form a complementary bit line across SRAM array 100 in the first direction Y. The word line portion WL of each SRAM cell 101 is coupled with the word line portions WL of adjacent SRAM cells 101 in a same row of the SRAM array 100 to form a word line across SRAM array 100 in the second direction X.

The plurality of first-type strap cells 103 are arranged in a row substantially parallel to at least one of the word line portions WL of the SRAM cells 101. Each first-type strap cell 103 comprises a first-type well strap structure (not shown). The first-type well strap structure is one of a P-type well strap structure or an N-type well strap structure. For ease of discussion, the first-type strap cell 103 is primarily discussed and illustrated as having a P-type well strap structure. Each first-type strap cell 103 is free from including a second-type well strap structure. A second-type well strap structure is, for example, the other of the N-type well strap structure or the P-type well strap structure included in the first-type strap cell 103. The first-type strap cell 103 is capable of being smaller than a strap cell that includes both P-type and N-type well strap structures.

The first-type well strap structure of the first-type strap cell 103 is configured to electrically connect a well type of the same type with the first voltage line Vss or the second voltage line Vdd. For example, if the first-type strap cell 103 comprises a P-type well strap structure, the P-type well strap structure is configured to electrically connect a P-type well of the first-type strap cell 103 with a first voltage connector (not shown). The first voltage connector is electrically coupled with the first voltage line Vss. In some embodiments, the first voltage connector is electrically coupled with the second voltage line Vdd. In some embodiments, first-type strap cells 103 are configured as dummy cells that are not used to store data. In some embodiments, the first-type strap cells 103 each comprise one or more dummy gate electrodes. In some embodiments, the first-type strap cells 103 each comprise at least six dummy gate electrodes.

The plurality of second-type strap cells 105 are arranged in a row substantially parallel to the at least one word line portion WL or at least one other word line portion WL of the SRAM cells 101. In some embodiments, the row of second-type strap cells 105 is substantially parallel to the row of first-type strap cells 103. Each second-type strap cell 105 comprises a second-type well strap structure (not shown). The second-type well strap structure is the other of the N-type well strap structure or the P-type well strap structure that is opposite the type of well strap structure included in the first-type strap cell 103. For ease of discussion, because the first-type strap cell 103 is primarily discussed and illustrated as having a P-type well strap structure, the second-type strap cell 105 is primarily discussed and illustrated as having an N-type well strap structure. Each second-type strap cell 105 is free from including a first-type well strap structure. The second-type strap cell 105 is capable of being smaller than a strap cell that includes both P-type and N-type well strap structures.

The second-type well strap structure of the second-type strap cell 105 is configured to electrically connect a well type of the same type with the other of second voltage line Vdd or the first voltage line Vss. For example, if the first-type strap cell 103 comprises a P-type well strap structure, then the second-type strap cell 105 comprises an N-type well strap structure. The N-type well strap structure is configured to electrically connect an N-type well of the second-type strap cell 105 with a second voltage connector (not shown). The second voltage connector is electrically coupled with the second voltage line Vdd. In some embodiments, the second voltage connector is electrically coupled with the first voltage line Vss if the first voltage connector is electrically coupled with the second voltage line Vdd. In some embodiments, second-type strap cells are configured as dummy cells that are not used to store data. In some embodiments, the second-type strap cells 105 each comprise one or more dummy gate electrodes. In some embodiments, the second-type strap cells 105 each comprise at least six dummy gate electrodes.

Each column of SRAM cells 101 is bracketed by one first-type strap cell 103 and one second-type strap cell 105. A first-type strap cell 103 is on a first end of the column of SRAM cells 101 and a second-type strap cell 105 is on a second end of the column of SRAM cells 101 opposite the first end of the column of SRAM cells 101.

The SRAM cells 101 are arranged in the columns of SRAM cells 101 having a cell pitch P in the first direction Y. The first-type strap cells 103 and the second-type strap cells 105 have a cell height H in the first direction Y. In some embodiments, the cell height H is equal to about three times the cell pitch P. In some embodiments, the cell pitch P is less than about 0.135 micrometers. If, for example, a first SRAM design rule designates a maximum quantity of bit cells per bit line as being 256 bits, and a maximum distance between well straps is set by a second SRAM design rule as being about 35 micrometers, then a cell pitch P that is about 0.135 micrometers results in an SRAM cell design that satisfies the first design rule and the second design rule. For example, 256 (bits)×0.135 micrometers (cell pitch) equals about 34.56 micrometers, which satisfies the second design rule for the maximum distance between well straps. In some embodiments, a maximum distance between a first-type strap cell 103 on a first end of a first column of SRAM cells 101 and a second-type strap cell 105 on a second end of the first column of SRAM cells 101 is less than about 33 micrometers.

In some embodiments, the maximum distance between the first-type strap cell 103 on the first end of the first column of SRAM cells 101 and the second-type strap cell 105 on a second end of the first column of SRAM cells 101 is set at a distance that results in SRAM array performance similar to an SRAM array that includes strap cells having both p-type and n-type strap structures. Accordingly, based on a size of the SRAM array 100, the SRAM array 100 optionally includes a greater quantity of rows of first-type strap cells 103 and/or second-type strap cells 105. In some embodiments, regardless of the quantity of rows of strap cells 103/105, the rows of strap cells 103/105 included in the SRAM array 100 alternate by the type of strap cell. For example, if a first row of strap cells in the SRAM array 100 includes the first-type of strap cells 103, then a next row of strap cells in the SRAM array 100 includes the second-type of strap cells 105.

The bit line portions BL and the complementary bit line portions BLB of the SRAM cells 101 are configured to be electrically connected to the sense amplifier 107. Dummy cells 106 are configured to provide connectivity to first voltage line Vss, second voltage line Vdd, and/or word line portions WL. In some embodiments, dummy cells 106 comprise a word line portion driver circuit for the word line portions WL.

Figure 2:
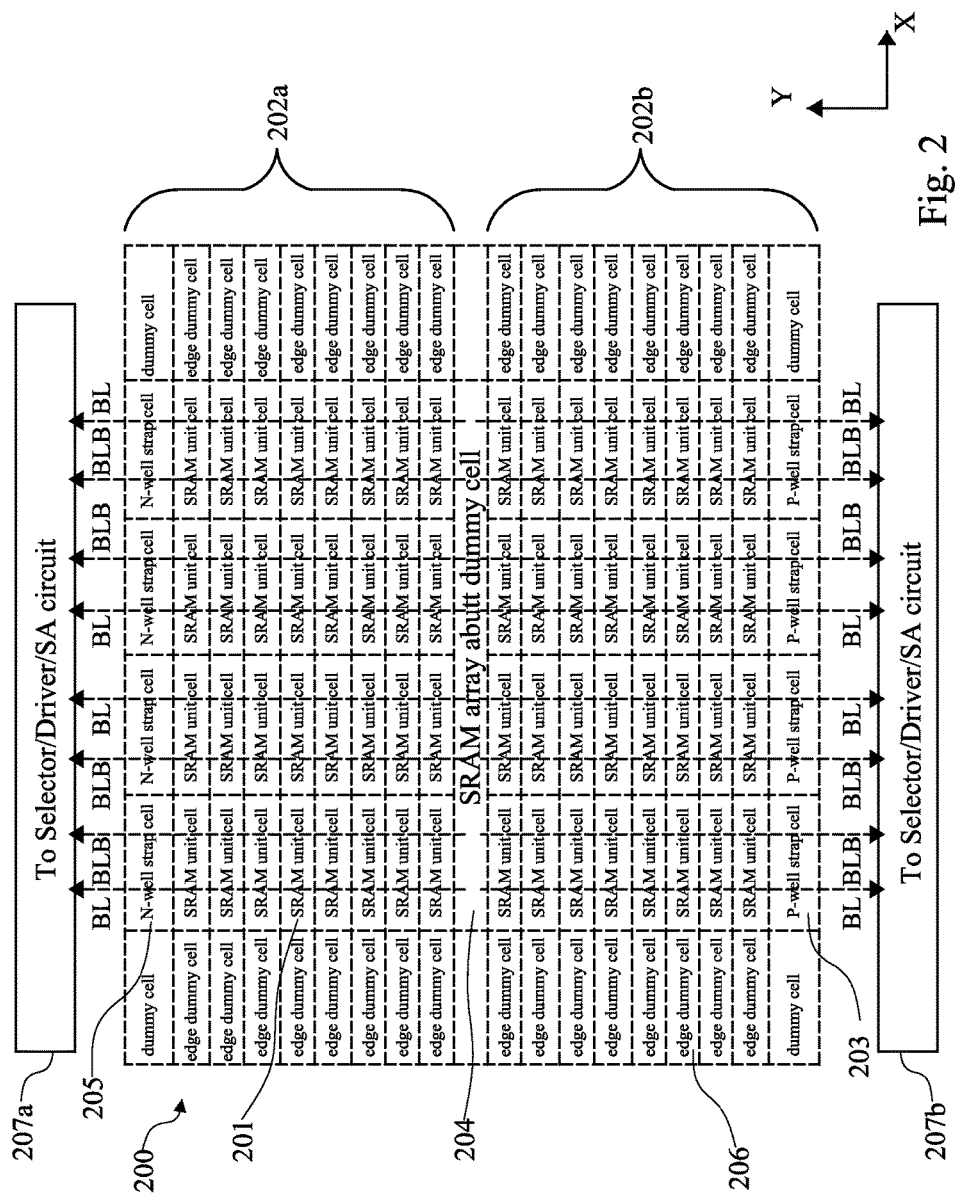
FIG. 2 is a plan view of an SRAM array, in accordance with one or more embodiments.

FIG. 2 is a plan view of an SRAM array 200, in accordance with one or more embodiments. SRAM array 200 comprises many of the features of SRAM array 100 (FIG. 1), with the reference numerals increased by 100. The SRAM cells 201 are divided into a first sub-array 202a having a first set of SRAM cells 201 and a second sub-array 202b having a second set of SRAM cells 201 excluded from the first set of SRAM cells 201. SRAM array 200 includes features configured to connect more than one sense amplifier 207 to the SRAM array 200, such as first sense amplifier 207a and second sense amplifier 207b.

SRAM array 200 includes at least one row of dummy cells 204. Dummy cells 204 isolate first sub-array 202a from second sub-array 202b. In some embodiments, SRAM array 200 includes a plurality of rows of dummy cells 204. The dummy cells 204 are equal in quantity to a quantity of columns of SRAM cells 201 included in SRAM array 200. The dummy cells 204 are arranged in the second direction X, and substantially align with the columns of SRAM cells 201 included in the SRAM array 200. The row of dummy cells 204 is positioned between the first sub-array 202a and the second sub-array 202b. The bit line portions BL of the SRAM cells 201 of the first sub-array 202a are physically separated from the bit line portions BL of the SRAM cells 201 of the second sub-array 202a. The complementary bit line portions BLB of the SRAM cells 201 of the first sub-array 201a are physically separated from the complementary bit line portions BLB of the SRAM cells 201 of the second sub-array 202b.

The bit line portions BL and the complementary bit line portions BLB of the SRAM cells 201 included in the first sub-array 202a are configured to be electrically connected to the first sense amplifier 207a. The bit line portions BL and the complementary bit line portions BLB of the SRAM cells 201 included in the second sub-array 202b are configured to be electrically connected to the second sense amplifier 207b different from the first sense amplifier 207a.

Figure 3:
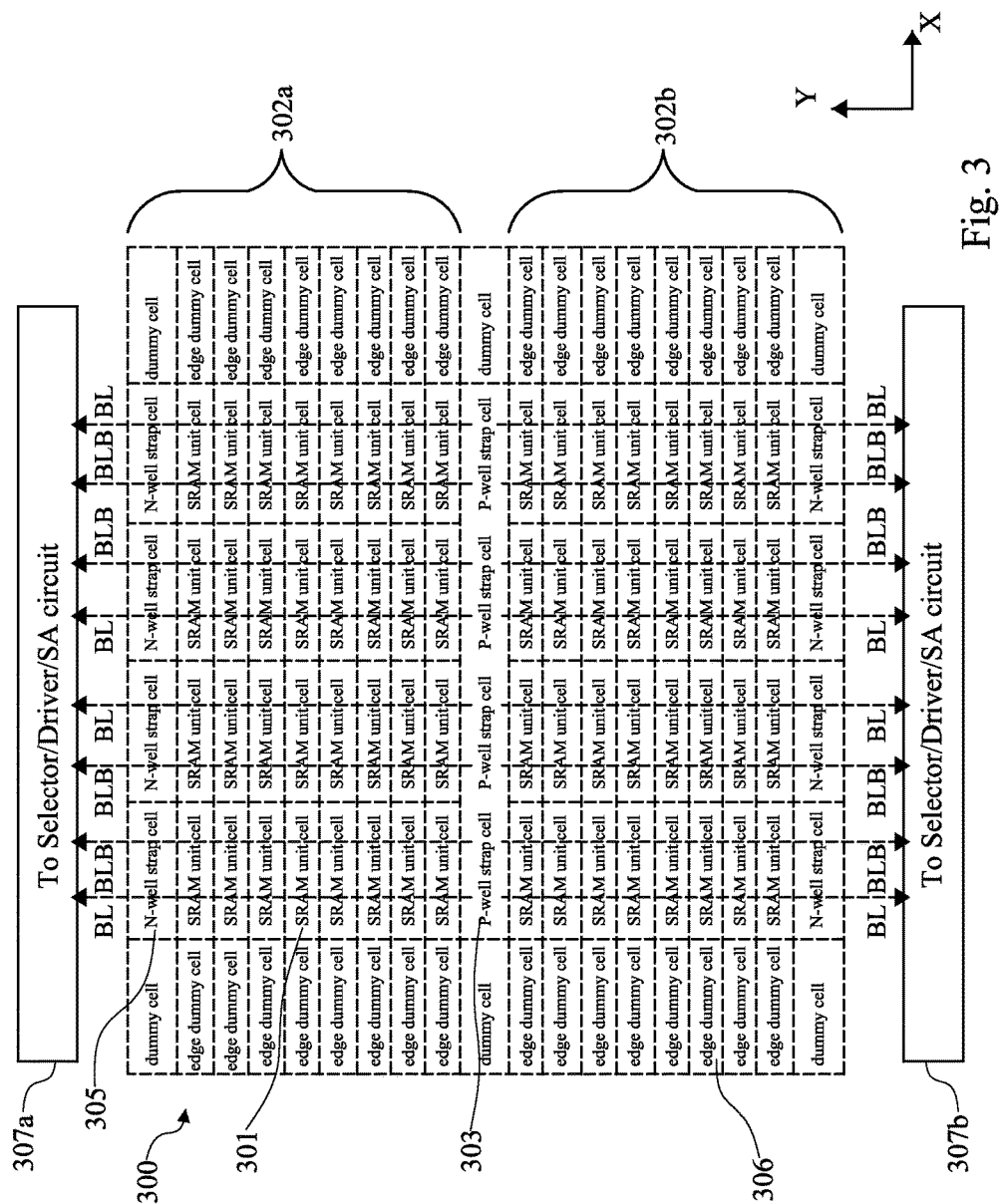
FIG. 3 is a plan view of an SRAM array, in accordance with one or more embodiments.

FIG. 3 is a plan view of an SRAM array 300, in accordance with one or more embodiments. SRAM array 300 comprises many of the features of SRAM array 200 (FIG. 2), with the reference numerals increased by 100. In SRAM array 300, the dummy cells 204 (FIG. 2) are replaced with the first-type strap cells 303. In some embodiments, the dummy cells 204 (FIG. 2) are replaced with the second-type strap cells 305. In other words, the first-type strap cells 303 or the second-type strap cells 305 are capable of being used as dummy cells to isolate abutting or adjacent sub-arrays such as first sub-array 303a and second sub-array 303b. SRAM array 300 includes multiple rows of first-type strap cells 303 and/or second-type strap cells 305 such that the SRAM array 300 alternates rows of first-type strap cells 303 and second-type strap cells 305. The rows of second-type strap cells 305 include a second-type strap cell 305 positioned at a first end of the columns of SRAM cells 301. The rows of the second-type strap cells 305 also include a second-type strap cell 305 positioned at a second end of the columns of SRAM cells 301 opposite the first end. The row of first-type strap cells 303 includes a first-type strap cell 303 positioned in the SRAM array 300 such that the first-type strap cells 303 are positioned between the first sub-array 302a and the second sub-array 302b.

The bit line portions BL and the complementary bit line portions BLB of the SRAM cells 301 included in the first sub-array 302a are configured to be electrically connected to the first sense amplifier 307a. The bit line portions BL and the complementary bit line portions BLB of the SRAM cells 301 included in the second sub-array 302b are configured to be electrically connected to the second sense amplifier 307b different from the first sense amplifier 307a.

Figure 4:
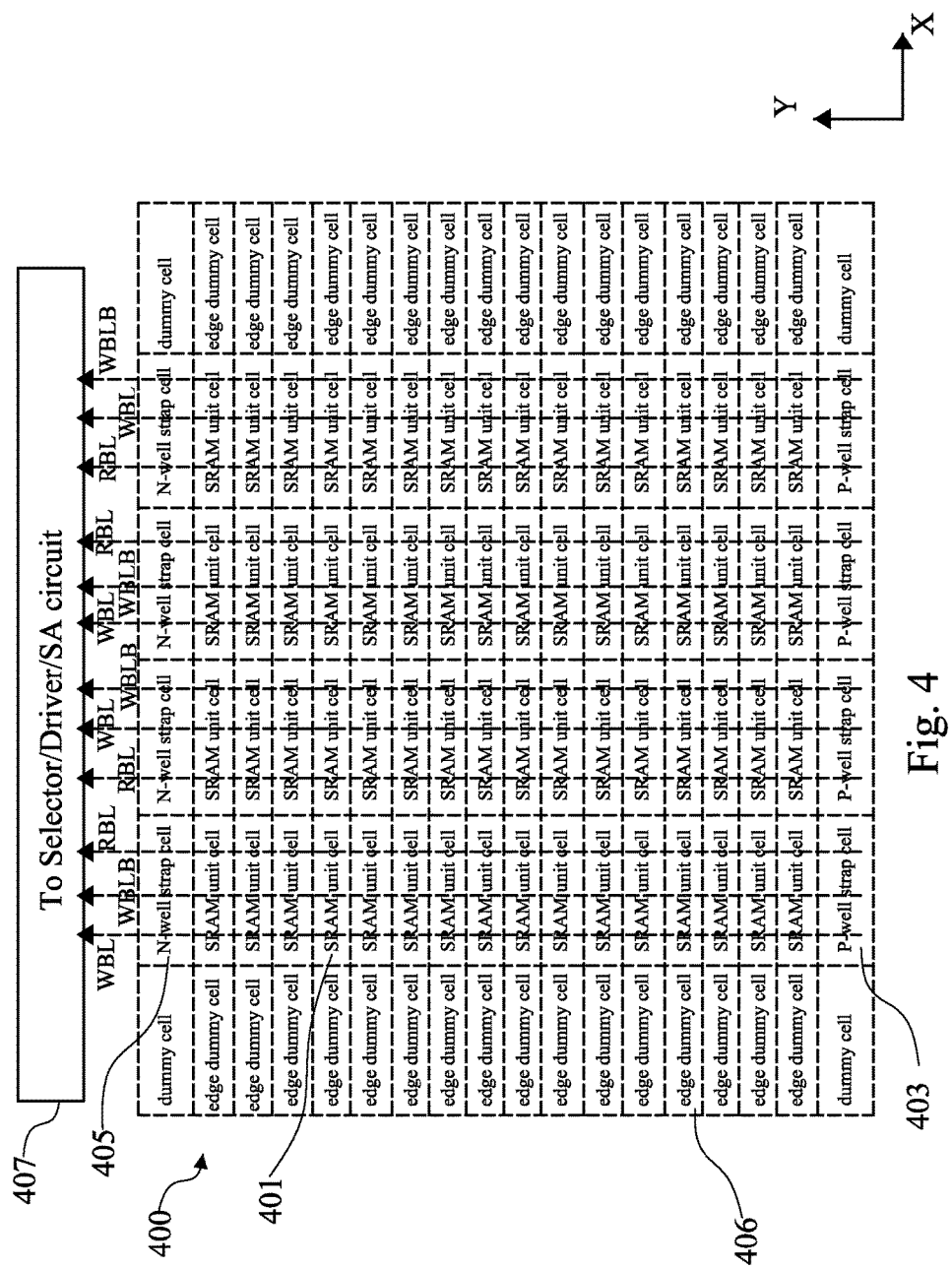
FIG. 4 is a plan view of a two-port SRAM array, in accordance with one or more embodiments.

FIG. 4 is a plan view of a two-port SRAM array 400, in accordance with one or more embodiments. SRAM array 400 comprises features similar to those discussed with respect to SRAM array 100 (FIG. 1), with the reference numerals increased by 300.

Each SRAM cell 401 comprises a read bit line portion RBL extending in the first direction Y, a write bit line portion WBL extending in the first direction Y, a complementary write bit line portion WBLB extending in the first direction Y, a write word line portion WWL (not shown) extending in the second direction X, a read word line portion RWL (not shown) extending in the second direction X, a connection to first voltage line Vss (not shown), and a connection to second voltage line Vdd (not shown). The read bit line portion RBL of each SRAM cell 401 is coupled with the read bit line portions RBL of the adjacent SRAM cells 401 in a same column of the SRAM array 400 to form a read bit line across SRAM array 400. The write bit line portion WBL of each SRAM cell 401 is coupled with the write bit line portions WBL of the adjacent SRAM cells 401 in a same column of the SRAM array 400 to form a write bit line across SRAM array 400. The complementary write bit line portion WBLB is coupled with the complementary write bit line portions WBLB of the adjacent SRAM cells 401 in the same column of the SRAM array 400 to form a complementary write bit line across SRAM array 100. The word line portion WL of each SRAM cell 401 is coupled with the word line portions WL of the adjacent SRAM cells 401 in a same row of the SRAM array 400 to form a word line across SRAM array 400.

The write bit line portions WBL, the complementary write bit line portions WBLB, and the read bit line portions RBL of the SRAM cells 401 are configured to be electrically connected to the sense amplifier 407.

Figure 5:
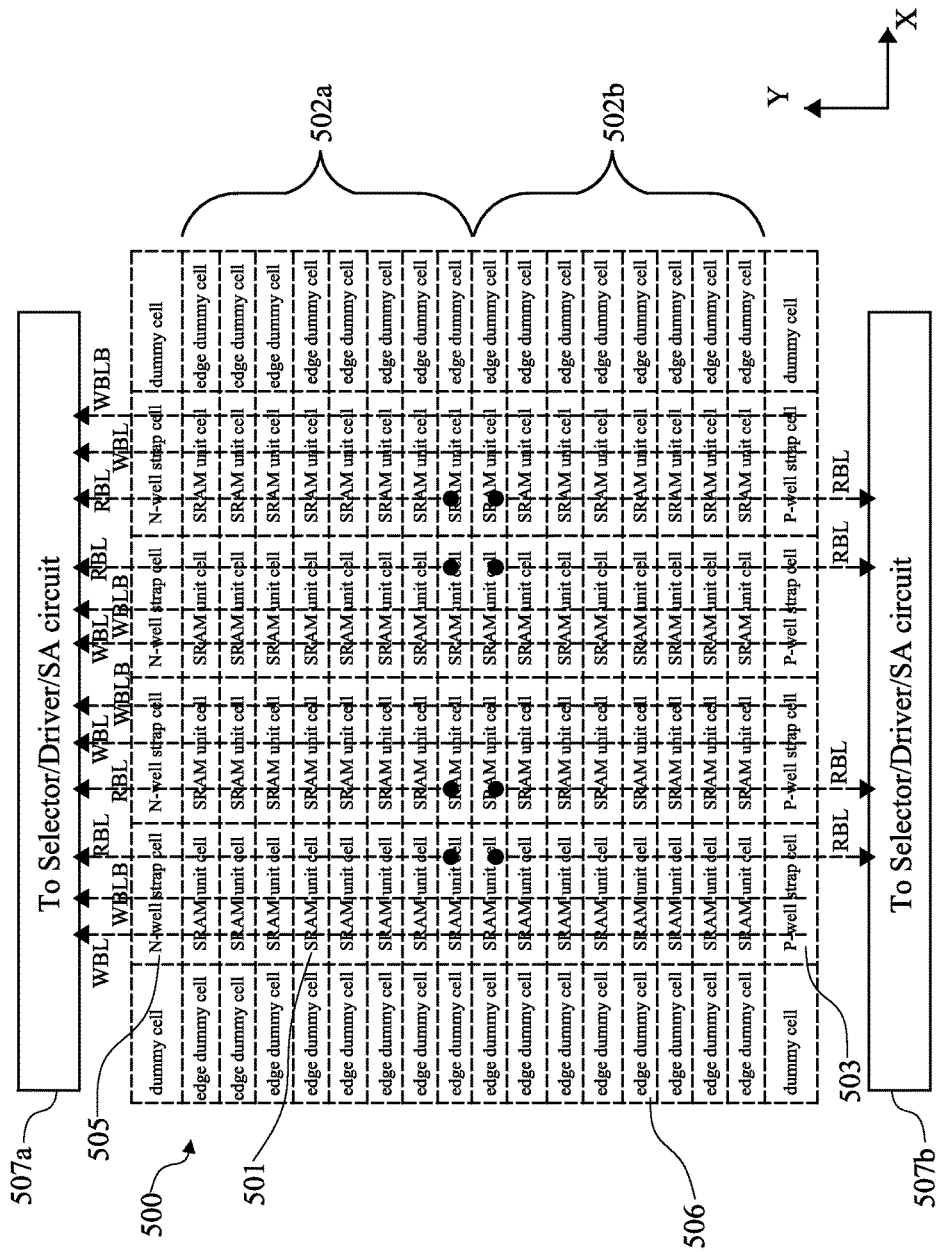
FIG. 5 is a plan view of a two-port SRAM array, in accordance with one or more embodiments.

FIG. 5 is a plan view of a two-port SRAM array 500, in accordance with one or more embodiments. SRAM array 500 comprises many of the features discussed with respect to SRAM array 400 (FIG. 4), with the reference numerals increased by 100. SRAM array 500 includes features configured to connect more than one sense amplifier 507 to the SRAM array 500, such as first sense amplifier 507a and second sense amplifier 507b.

In SRAM 500, the SRAM cells 501 are divided into a first sub-array 502a having a first set of SRAM cells 501 and a second sub-array 502b having a second set of SRAM cells 501 excluded from the first set of SRAM cells 501. The first sub-array 502a abuts the second sub-array 502b, i.e., no intervening row of dummy cells is present between the second sub-array 502b and the first sub-array 502a. At least one first column of SRAM cells 501 of the first sub-array 502a is substantially aligned with at least one second column of SRAM cells 501 of the second sub-array 502b with respect to the second direction X.

The write bit line portions WBL of the SRAM cells 501 of the first sub-array 502a arranged in the at least one first column are electrically connected with the write bit line portions WBL of the SRAM cells 501 of the second sub-array 502b arranged in the at least one second column. The complementary write bit line portions WBLB of the SRAM cells 501 of the first sub-array 502a arranged in the at least one first column are electrically connected with the complementary write bit line portions WBLB of the SRAM cells 501 of the second sub-array 502b arranged in the at least one second column.

The read bit line portions RBL of the first sub-array 502a are physically separated from the read bit line portions RBL of the second sub-array 502b. For example, the read bit line portions RBL of the SRAM cells 501 of the first sub-array 502a arranged in the at least one first column are physically separated from the read bit line portions RBL of the SRAM cells 501 of the second sub-array 502b arranged in the at least one second column.

The read bit line portions RBL of the SRAM cells 501 included in the first sub-array 502a are configured to be electrically connected to the first sense amplifier 507a. The read bit line portions RBL of the SRAM cells 501 included in the second sub-array 502b are configured to be electrically connected to the second sense amplifier 507b. The write bit line portions WBL of the SRAM cells 501 included in the first sub-array 502a and the write bit line portions WBL of the SRAM cells 501 included in the second sub-array 502b are configured to be electrically connected to the first sense amplifier 507a. The complementary write bit line portions WBLB of the SRAM cells 501 included in the first sub-array 502a and the complementary write bit line portions WBLB of the SRAM cells 501 included the second sub-array 502b are configured to be electrically connected to the first sense amplifier 507a.

Figure 6:
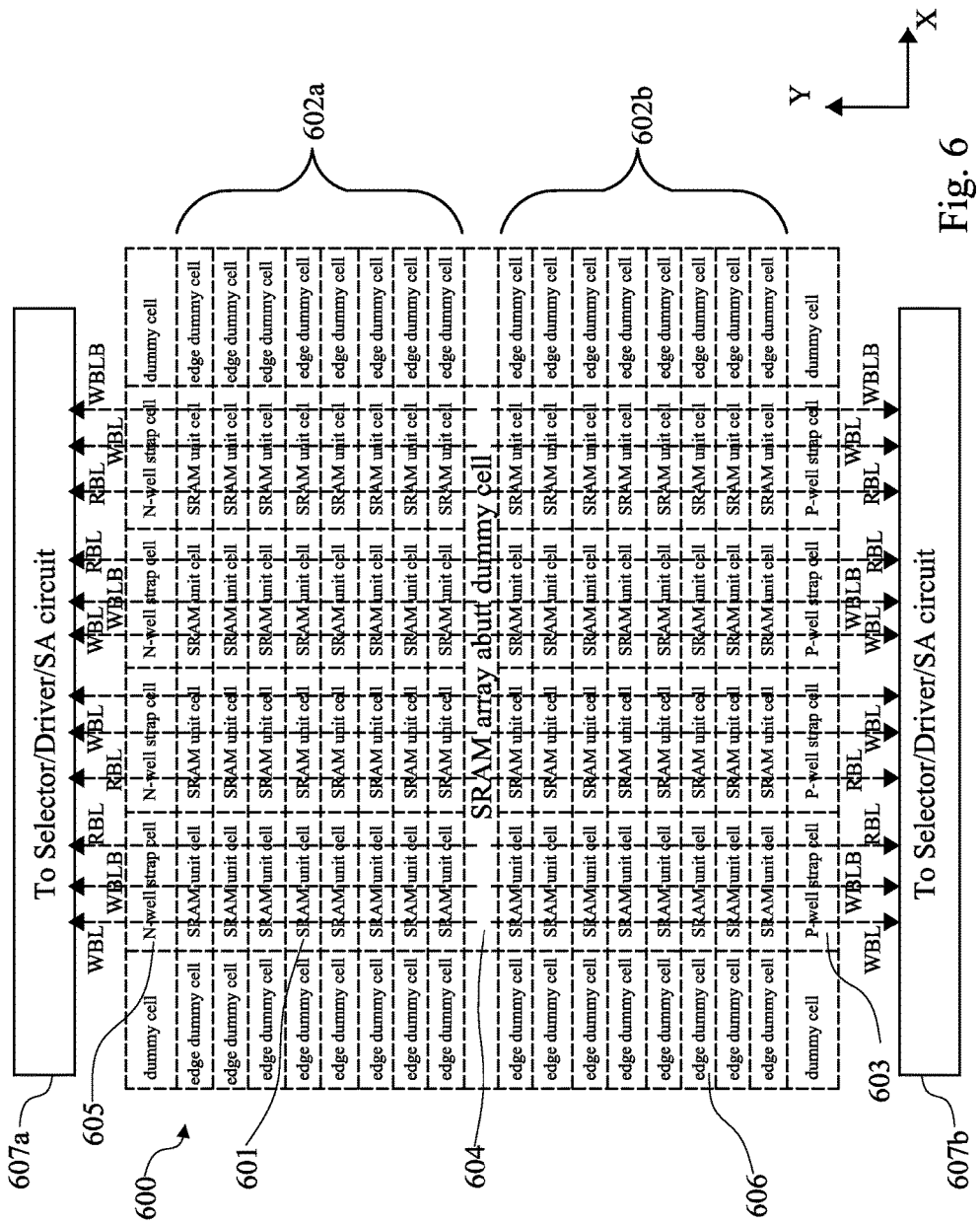
FIG. 6 is a plan view of a two-port SRAM array, in accordance with one or more embodiments.

FIG. 6 is a plan view of a two-port SRAM array 600, in accordance with one or more embodiments. SRAM array 600 comprises many of the features discussed with respect to SRAM array 500 (FIG. 5) with the reference numerals increased by 100.

SRAM array 600 includes at least one row of dummy cells 604. In some embodiments, SRAM array 600 includes a plurality of rows of dummy cells 604. The dummy cells 604 are equal in quantity to a quantity of columns of SRAM cells 601 included in the SRAM array 600. The dummy cells 604 are arranged in the second direction X, and substantially align with the columns of SRAM cells 601 included in the SRAM array 600. The row of dummy cells 604 is positioned between the first sub-array 602a and the second sub-array 602b.

The read bit line portions RBL of the first sub-array 602a are physically separated from the read bit line portions RBL of the second sub-array 602b. For example, the read bit line portions RBL of the SRAM cells 601 of the first sub-array 602a arranged in the at least one first column are physically separated from the read bit line portions RBL of the SRAM cells 601 of the second sub-array 602b arranged in the at least one second column. The read bit line portions RBL of the SRAM cells 601 included in the first sub-array 602a are configured to be electrically connected to the first sense amplifier 607a. The read bit line portions RBL of the SRAM cells 601 included the second sub-array 602b are electrically connected to the second sense amplifier 607b.

In comparison with SRAM array 500, the write bit line portions WBL of the SRAM cells 601 of the first sub-array 602a are physically separated from the write bit line portions WBL of the SRAM cells 601 of the second sub-array 602a. The complementary write bit line portions WBLB of the SRAM cells 601 of the first sub-array 601a are physically separated from the complementary write bit line portions WBLB of the SRAM cells 601 of the second sub-array 602b. The write bit line portions WBL of the SRAM cells 601 included in the first sub-array 602a and the complementary write bit line portions WBLB of the SRAM cells 601 included the first sub-array 602a are configured to be electrically connected to the first sense amplifier 507a. The write bit line portions WBL of the SRAM cells 601 included in the second sub-array 602b and the complementary write bit line portions WBLB of the SRAM cells 601 included the second sub-array 602b are configured to be electrically connected to the second sense amplifier 607b.

Figure 7:
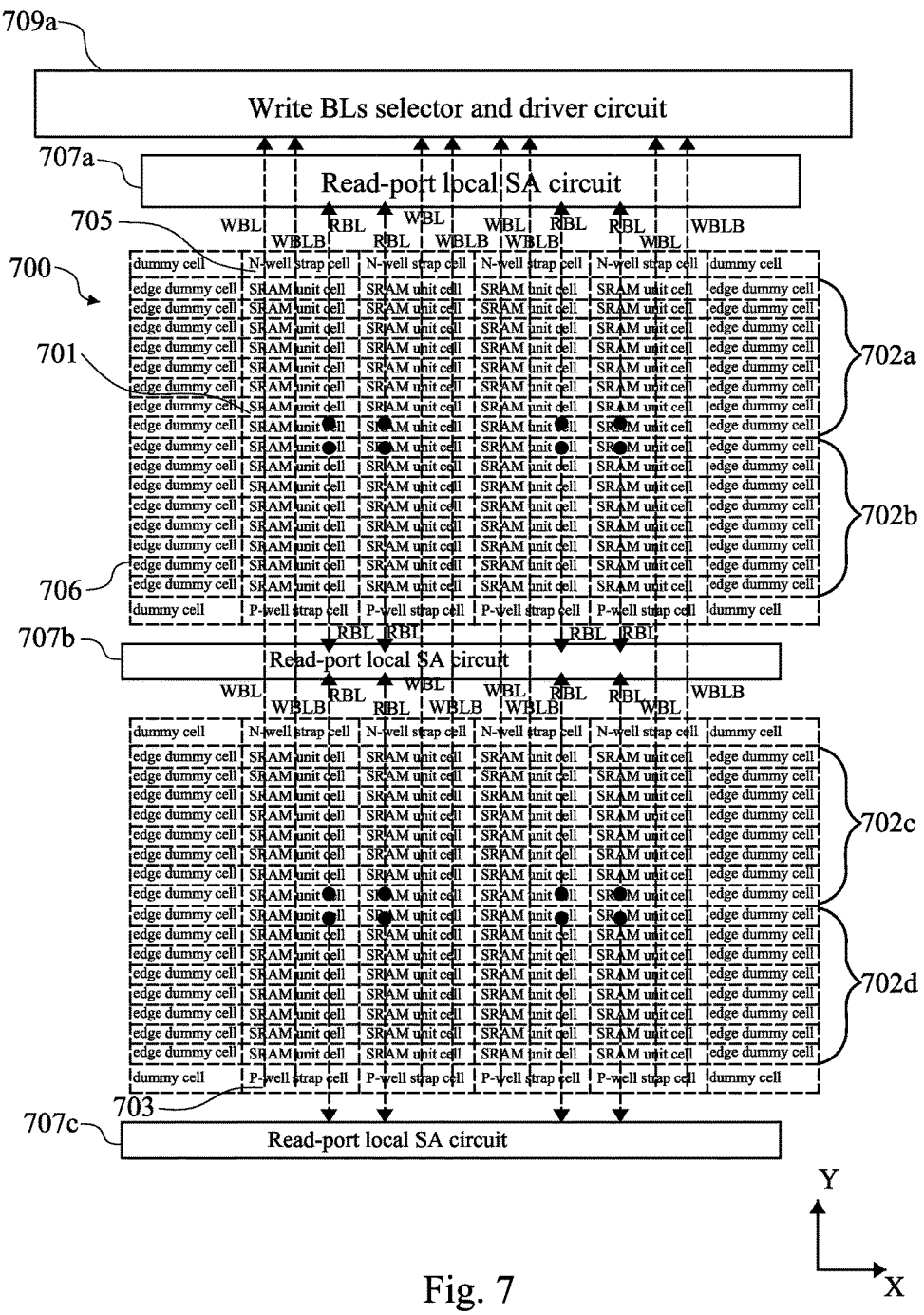
FIG. 7 is a plan view of a two-port SRAM array, in accordance with one or more embodiments.

FIG. 7 is a plan view of a two-port SRAM array 700, in accordance with one or more embodiments. SRAM array 700 comprises many of the features discussed with respect to SRAM array 500 (FIG. 5), with the reference numerals increased by 200.

In SRAM 700, the SRAM cells 701 are divided into a first sub-array 702a, a second sub-array 702b, a third sub-array 702c, and a fourth sub-array 702d. The first sub-array 702a includes a first set of SRAM cells 701. The second sub-array 702b includes a second set of SRAM cells 701 excluded from the first set of SRAM cells 701. The third sub-array 702c includes a third set of SRAM cells 701 excluded from the first set of SRAM cells 701 and the second set of SRAM cells 701. The fourth sub-array 702d includes a fourth set of SRAM cells 701 excluded from the first set of SRAM cells 701, the second set of SRAM cells 701, and the third set of SRAM cells 701.

The first sub-array 702a abuts the second sub-array 702b. The third sub-array 702c abuts the fourth sub-array 702c. At least one first column of SRAM cells 701 of the first sub-array 702a is substantially aligned with at least one second column of SRAM cells 701 of the second sub-array 702b with respect to the second direction X. At least one third column of SRAM cells 701 of the third sub-array 702c is substantially aligned with at least one fourth column of SRAM cells 701 of the fourth sub-array 702d with respect to the second direction X. Each column of SRAM cells 701 of each sub-array 702a-702d is bracketed by at least one first-type strap cell 703 or at least one second-type strap cell 705. In some embodiments, each column of SRAM cells 701 of each sub-array 702a-702d is bracketed by a plurality of first-type strap cells 703 or a plurality of second-type strap cell 705.

For example, first sub-array 702a has a row of second-type strap cells 705 at a first end of the columns of SRAM cells 701 included in the first sub-array 702a. First sub-array 702a also has a row of SRAM cells 701 at a second end of the columns of SRAM cells 701 included in first sub-array 702a where first sub-array 702a abuts second sub-array 702b. Second sub-array 702b has a row of first-type strap cells 703 at a first end of the columns of SRAM cells 701 included in the second sub-array 702b. Second sub-array 702b also has a row of SRAM cells 701 at a second end of the columns of SRAM cells 701 included in second sub-array 702b where first sub-array 702a abuts second sub-array 702b. Similarly, third sub-array 702c has a row of second-type strap cells 705 at a first end of the columns of SRAM cells 701 includes in the third sub-array 702c. Third sub-array 702c also has a row of SRAM cells 701 at a second end of the columns of SRAM cells 701 included in third sub-array 702c where third sub-array 702c abuts fourth sub-array 702d. Fourth sub-array 702d has a row of first-type strap cells 703 at a first end of the columns of SRAM cells 701 included in the fourth sub-array 702d. Fourth sub-array 702d also has a row of SRAM cells 701 at a second end of the columns of SRAM cells 701 included in fourth sub-array 702d where third sub-array 702c abuts fourth sub-array 702d.

In other words, first sub-array 702a has a row of strap cells between the SRAM cells 701 of the first sub-array 702a and the first sense amplifier 707a, the second sub-array 702b has a row of strap cells between the SRAM cells 701 of the second sub-array 702b and the second sense amplifier 707b, the third sub-array 702c has a row of strap cells between the SRAM cells 701 of the third sub-array 702c and the second sense amplifier 707b, and the fourth sub-array 707d has a row of strap cells between the SRAM cells 701 of the fourth sub-array 702d and a third sense amplifier 707c.

In some embodiments, SRAM array 700 includes one or more rows of dummy cells such as dummy cells 604 (FIG. 6) between the first sub-array 702a and the second sub-array 702b. In some embodiments, SRAM 700 includes one or more rows of dummy cells such as dummy cells 604 between the third sub-array 702c and the fourth sub-array 702d. In other embodiments, SRAM array 700 includes one or more rows of strap cells such as first-type strap cells 703 or second-type strap cells 705 between the first sub-array 702a and the second sub-array 702b. In some embodiments, SRAM array 700 includes one or more rows of strap cell such as first-type strap cells 703 or second-type strap cells 705 between the third sub-array 702c and the fourth sub-array 702d.

The write bit line portions WBL of the SRAM cells 701 included in the first sub-array 702a arranged in the at least one first column are electrically connected with the write bit line portions WBL of the SRAM cells 701 included in the second sub-array 702b arranged in the at least one second column. The write bit line portions WBL of the SRAM cells 701 included in the third sub-array 702c arranged in the at least one third column are electrically connected with the write bit line portions WBL of the SRAM cells 701 included in the fourth sub-array 702d arranged in the at least one fourth column. The write bit line portions WBL of the SRAM cells 701 included in the third sub-array 702c arranged in the at least one third column are electrically connected with the write bit line portions WBL of the SRAM cells 701 included in the second sub-array 702b arranged in the at least one second column.

The complementary write bit line portions WBLB of the SRAM cells 701 included in the first sub-array 702a arranged in the at least one first column are electrically connected with the complementary write bit line portions WBLB of the SRAM cells 701 included in the second sub-array 702b arranged in the at least one second column. The complementary write bit line portions WBLB of the SRAM cells 701 included in the third sub-array 702c arranged in the at least one third column are electrically connected with the complementary write bit line portions WBLB of the SRAM cells 701 included in the fourth sub-array 702d arranged in the at least one fourth column. The complementary write bit line portions WBLB of the SRAM cells 701 included in the third sub-array 702c arranged in the at least one third column are electrically connected with the complementary write bit line portions WBLB of the SRAM cells 701 included in the second sub-array 702b arranged in the at least one second column.

The read bit line portions RBL of the first sub-array 702a are physically separated from the read bit line portions of the second sub-array 702b. For example, the read bit line portions RBL of the SRAM cells 701 included in the first sub-array 702a arranged in the at least one first column are physically separated from the read bit line portions RBL of the SRAM cells 701 included in the second sub-array 702b arranged in the at least one second column. Similarly, the read bit line portions RBL of the third sub-array 702c are physically separated from the read bit line portions RBL of the fourth sub-array 702d. For example, the read bit line portions RBL of the SRAM cells 701 included in the third sub-array 702c arranged in the at least third first column are physically separated from the read bit line portions RBL of the SRAM cells 701 included in the fourth sub-array 702d arranged in the at least one fourth column.

The read bit line portions RBL of the SRAM cells 701 included in the first sub-array 702a are configured to be electrically connected to the first sense amplifier 707a. The read bit line portions RBL of the SRAM cells 701 included the second sub-array 702b are configured to be electrically connected to the second sense amplifier 707b. The read bit line portions RBL of the SRAM cells 701 included in the third sub-array 702c are configured to be electrically connected to the second sense amplifier 707b. The read bit line portions RBL of the SRAM cells 701 included the fourth sub-array 702d are configured to be electrically connected to the third sense amplifier 707c. The sense amplifiers 707a-707c are local read-port sense amplifier circuits.

The write bit line portions WBL of the SRAM cells 701 included in the sub-arrays 702a-702d are configured to be electrically connected to a global selector and driver circuit 709. The complementary write bit line portions WBLB of the SRAM cells 701 included in the sub-arrays 702a-702d are configured to be electrically connected to the global selector and driver circuit 709. The global selector and driver circuit 709 is a write selector and driver circuit.

In some embodiments, the write bit line portions WBL of the SRAM cells 701 included in the sub-arrays 702a-702d are configured to be electrically connected to the first sense amplifier 707a, the second sense amplifier 707b, or the third sense amplifier 707c. In some embodiments, the complementary write bit line portions WBLB of the SRAM cells 701 included in the sub-arrays 702a-702d are configured to be electrically connected to the first sense amplifier 707a, the second sense amplifier 707b, or the third sense amplifier 707c.

Figure 8:
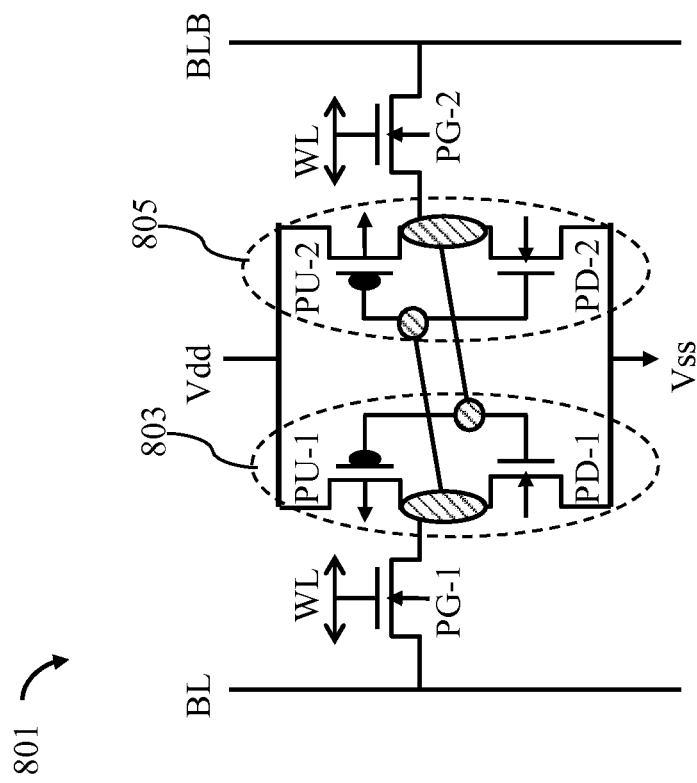
FIG. 8 is a circuit diagram of an SRAM cell, in accordance with one or more embodiments.

FIG. 8 is a circuit diagram of an SRAM cell 801, in accordance with one or more embodiments. SRAM cell 801 is usable as one of the SRAM cells included in the SRAM arrays discussed herein. In some embodiments, for example, SRAM cell 801 is usable as one or more SRAM cells 101 (FIG. 1) included in SRAM array 100 (FIG. 1).

SRAM cell 801 comprises bit line portion BL, complementary bit line portion BLB, word line portion WL, a connection to first voltage line Vss and a connection to second voltage line Vdd. SRAM cell 801 also comprises a first inverter 803, a second inverter 805, a first pass gate PG-1 and a second pass gate PG-2.

First inverter 803 comprises a first pull down transistor PD-1 and a first pull up transistor PU-1. In some embodiments, first pull down transistor PD-1 is an n-type metal oxide semiconductor (NMOS) transistor and first pull up transistor PU-1 is a p-type metal oxide semiconductor (PMOS) transistor. Second inverter 805 comprises a second pull down transistor PD-2 and a second pull up transistor PU-2. In some embodiments, second pull down transistor PD-2 is an NMOS transistor and second pull up transistor PU-2 is a PMOS transistor. Each of the first pull up transistor PU-1, the second pull up transistor PU-2, the first pull down transistor PD-1 and the second pull-down transistor PD-2 comprise source/drain regions, a well region, and a gate electrode.

The second inverter 805 is cross-coupled with the first inverter 803. The drain of the second pull down transistor PD-2 and the drain of the second pull up transistor PU-2 are coupled with the gate of the first pull down transistor PD-1 and the gate of the first pull up transistor PU-1. The drain of the first pull down transistor PD-1 and the drain of the first pull up transistor PU-1 are coupled with the gate of the second pull down transistor PD-2 and the gate of the second pull up transistor PU-2.

A source of the first pass gate PG-1 is coupled with the bit line portion BL, a gate of the first pass gate PG-1 is coupled with the word line portion WL, and a drain of the first pass gate PG-1 is coupled with the drain of the first pull up transistor PU-1 and the drain of the first pull down transistor PD-1. A source of the second pass gate PG-2 is coupled with the complementary bit line portion BLB, a gate of the second pass gate PG-2 is coupled with the word line portion WL, and a drain of the second pass gate PG-2 is coupled with the drain of the second pull up transistor PU-2 and the drain of the second pull down transistor PD-2. In some embodiments, the first pass gate PG-1 and the second pass gate PG-2 are data read/write control transistors. Each of the first pass gate PG-1 and the second pass gate PG-2 comprise source/drain regions, a well region, and a gate electrode.

The source of the first pull up transistor PU-1 and the source of the second pull up transistor PU-2 are coupled with the second voltage line Vdd. The source of the first pull down transistor PD-1 and the source of the second pull down transistor PD-2 are coupled with the first voltage line Vss.

Figure 9:
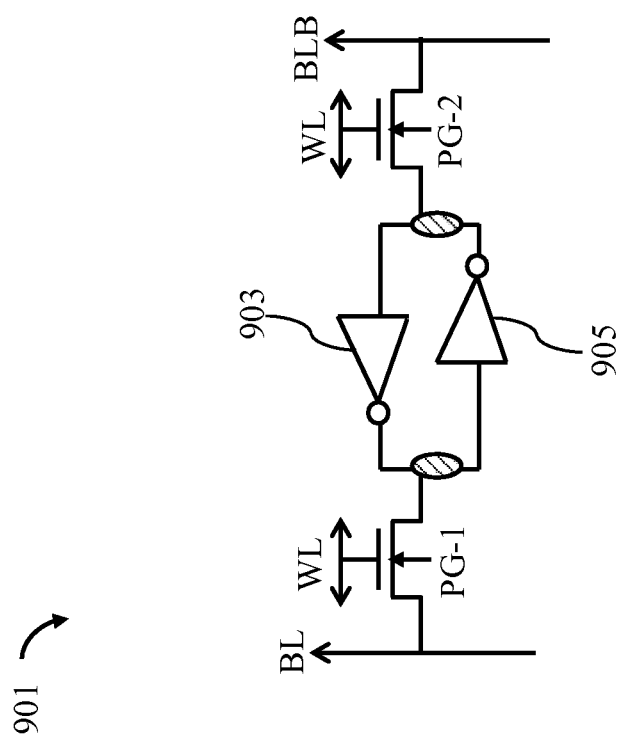
FIG. 9 is a circuit diagram of an SRAM cell, in accordance with one or more embodiments.

FIG. 9 is a circuit diagram of an SRAM cell 901, in accordance with one or more embodiments. SRAM cell 901 is a high level view of SRAM cell 801 (FIG. 8), with the reference numerals increased by 100. SRAM cell 901 includes first inverter 903 and second inverter 905. An output of first inverter 903 is coupled with an input of second inverter 905. An output of second inverter 905 is coupled with an input of first inverter 903.

Figure 10:
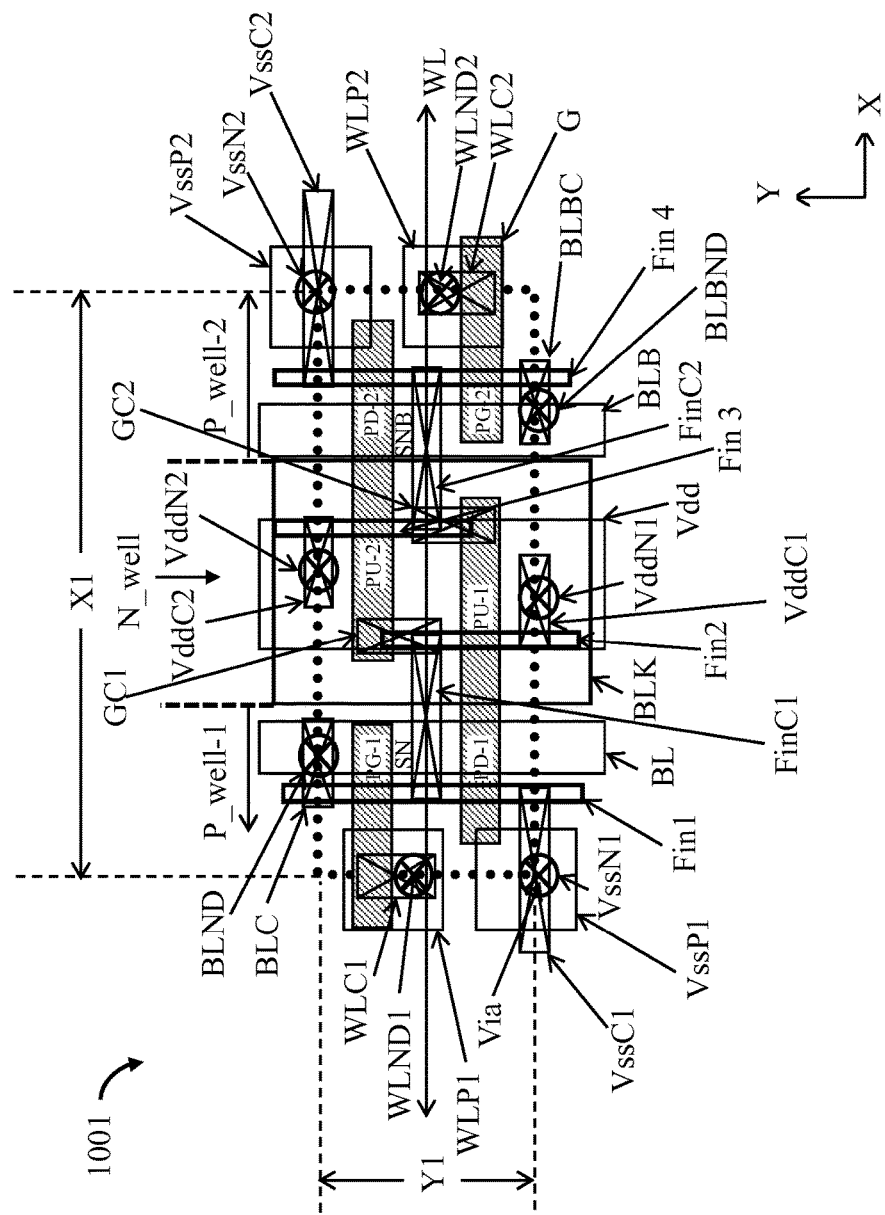
FIG. 10 is a layout view of an SRAM cell, in accordance with one or more embodiments.

FIG. 10 is a layout view of an SRAM cell 1001, in accordance with one or more embodiments. SRAM cell 1001 is a six-transistor (6T) SRAM cell that is an example embodiment of SRAM cell 801 (FIG. 8). SRAM cell 1001 is described as a finFET device. As such, FIG. 10 includes local interconnects, fin structures, and wells for a 6T SRAM cell using single fin finFET devices. SRAM cell 1001 includes many of the features discussed with respect to SRAM cell 801. SRAM cell 1001 also includes semiconductor fin structures Fin1, Fin2, Fin3, and Fin4. SRAM cell 1001 includes vias in one or more layers that are over or under a corresponding contact or landing pad. Vias are illustrated as circular shapes with an "X" in the center. The vias extend vertically (into and out of the page) and are configured to provide connections between conductive layers on different levels of SRAM cell 1001. SRAM cell 1001 has a pitch Y1 in the first direction Y and pitch X1 in the second direction X. In some embodiments, the ratio of X1 to Y1 is greater than or equal to 2.

Fin structures Fin1 and Fin4 are over P_well-1 and P_well-2, respectively. Fin structures Fin2 and Fin3 are over an N_well region to provide the semiconductor region for the first pull up transistor PU-1 and the second pull up transistor PU-2. In some embodiments, the N_well region also provides a contact for the body or bulk terminal BLK of the first pull up transistor PU-1 and the second pull up transistor PU-2.

Fin structure Fin1 provides channel, source and drain regions for the first pull down transistor PD-1 and the first pass gate PG-1. Fin structure Fin2 provides channel, source and drain regions for the first pull up transistor PU-1. Fin structure Fin3 provides channel, source and drain regions for the second pull up transistor PU-2. Fin structure Fin4 provides channel, source and drain regions for the second pull down transistor PD-2 and the second pass gate PG-2.

Gate material G, which forms the gate electrodes for each of transistors PU-1, PU-2, PD-1, PD-2, PG-1 and PG-2 is over fin structures Fin1, Fin2, Fin3 and Fin4. The source and drain regions for transistors PU-1, PU-2, PD-1, PD-2, PG-1 and PG-2 are in the corresponding fin structures on opposite sides of the gate electrode of each corresponding transistor PU-1, PU-2, PD-1, PD-2, PG-1 and PG-2.

Fin structures Fin1, Fin2, Fin3 and Fin4 are configured as connection points to conductive features on levels of the SRAM cell 1001 that are above the fin structures Fin1, Fin2, Fin3 and Fin4 such as bit line portion BL, complementary bit line portion BLB, word line portion WL, first voltage line Vss (FIG. 8) and second voltage line Vdd.

First pass gate PG-1 is electrically connected with word line portion WL at word line node WLND1 by way of fin structure Fin1, word line portion landing pad WLP1, word line portion contact WLC1 and at least one via. Second pass gate PG-2 is electrically connected with word line portion WL at word line node WLND2 by way of fin structure Fin4, word line portion landing pad WLP2, word line portion contact WLC2 and at least one via. First pass gate PG-1 is electrically connected with bit line portion BL by way of fin structure Fin1, bit line portion contact BLC and at least one via at bit line node BLND. Second pass gate PG-2 is electrically connected with complementary bit line portion BLB by way of fin structure Fin4, complementary bit line portion contact BLBC and at least one via at complementary bit line node BLBND.

First pull-up transistor PU-1 is electrically connected to second voltage line Vdd by way of fin structure Fin2, voltage contact VddC1 and at least one via at voltage node VddN1. Second pull-up transistor PU-2 is electrically connected to second voltage line Vdd by way of fin structure Fin3, voltage contact VddC2 and at least one via at voltage node VddN2.

First pull-down transistor PD-1 is electrically connected to first voltage line Vss by way of fin structure Fin1, voltage line landing pad VssP1, voltage contact VssC1 and at least one via at voltage node VssN1. Second pull-down transistor PD-2 is electrically connected to first voltage line Vss by way of fin structure Fin4, voltage line landing pad VssP2, voltage contact VssC2 and at least one via at voltage line VssN2.

The various contacts are configured to provide vertical connections between conductive features of the SRAM cell 1001 on different levels of the SRAM cell 1001. In some embodiments, some of the contacts are over one or more of the fin structures Fin1, Fin2, Fin3 or Fin4, and some of the contacts are over the gate material G of one or more of transistors PU-1, PU-2, PD-1, PD-2, PG-1 and PG-2. Some of the contacts are configured to electrically connect elements of the SRAM cell 1001 that are on a same level. For example, fin structure Fin1 is coupled with fin structure Fin2 by a first fin contact FinC1. Similarly, fin structure Fin3 is coupled with fin structure Fin4 by a second fin contact FinC2. In some embodiments, one or more of first fin contact FinC1 is coupled with the gate of second pull up transistor PU-2 by way of a first gate contact GC1, and second fin contact FinC2 is coupled with the gate of first pull up transistor PU-1 by way of a second gate contact GC2.

First fin contact FinC1 and first gate contact GC1 together couple the gate of second pull up transistor PU-2 with the source/drain regions of first pull up transistor PU-1 (i.e., fin structure Fin2) and the source/drain regions of first pull down transistor PD-1 (i.e., fin structure Fin1), forming storage node SN. Similarly, second fin contact FinC2 and second gate contact GC2 together couple the gate of first pull up transistor PU-1 with the source/drain regions of second pull up transistor PU-2 (i.e., fin structure Fin3) and the source/drain regions of second pull down transistor PD-2 (i.e., fin structure Fin4), forming storage node SNB.

Figure 11:
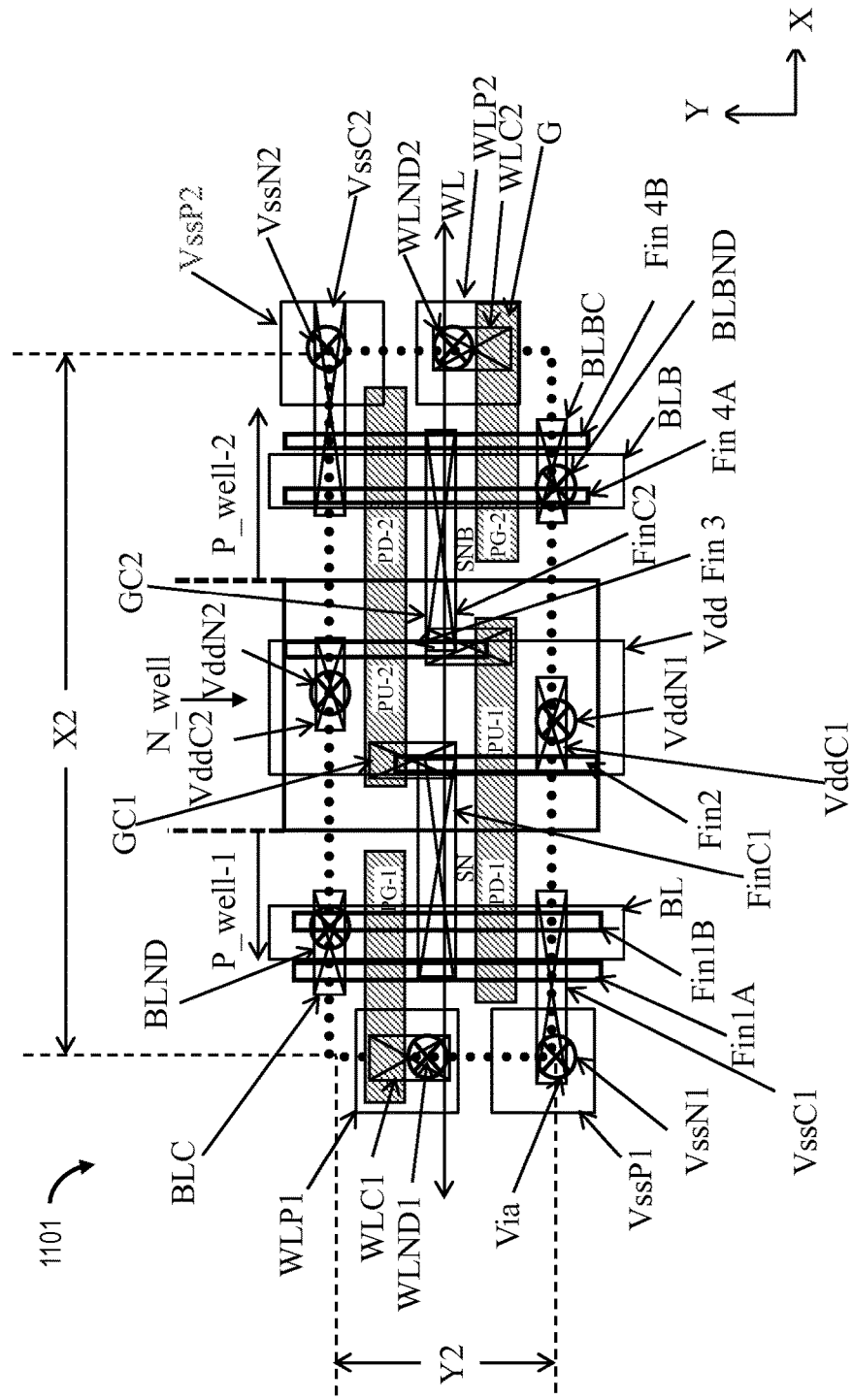
FIG. 11 is a layout view of an SRAM cell, in accordance with one or more embodiments.

FIG. 11 is a layout view of an SRAM cell 1101, in accordance with one or more embodiments. SRAM cell 1101 is a six-transistor (6T) SRAM cell that is an example embodiment of SRAM cell 801 (FIG. 8). SRAM cell 1101 differs from SRAM cell 1001 (FIG. 10) in that SRAM cell 1101 is a multi-fin finFET SRAM cell. SRAM cell 1101 is capable of functioning in a similar manner to that of SRAM cell 1001. In use, compared to SRAM cell 1001, SRAM cell 1101 has added drive strength, which makes it possible to simplify the power connections to SRAM cells that are multi-fin finFET structures.

Compared to SRAM cell 1001, the fin structure for pull down transistor PD-1 and pass gate transistor PG-1 is doubled to two fin structures that include fin structures Fin1A and Fin1B, electrically coupled in parallel. Gate material G for first pass gate PG-1 extends over both fin structures Fin1A and Fin1B. Bit line contact BLC couples fin structures Fin1A and Fin1B together at one source/drain terminal of first pass gate PG-1. Source/drain terminals for first pull down transistor PD-1 are formed on fin structures Fin1A and Fin1B. Gate material G for first pull down transistor PD-1 extends over both fin structures Fin1A and Fin1B. Voltage contact VssC1 couples fin structures Fin1A and Fin1B together at one source/drain terminal of first pull down transistor PD-1. First fin contact FinC1 of storage node SN couples the remaining source/drain terminals of first pass gate PG-1 and first pull down transistor PD-1 together so that the two fin structures Fin1A and Fin1B form a single, larger drive transistor for first pass gate PG-1 and first pull down transistor PD-1. Second pass gate PG-2 and second pull down transistor PD-2 are similarly formed over fin structures Fin4A and Fin4B. Fin structures Fin4A and Fin 4B are similarly electrically coupled in parallel by complementary bit line contact BLBC, voltage contact VssC2, and second fin contact FinC2 of storage node SNB so that the two fin structures Fin4A and Fin4B form a single, larger drive transistor for second pass gate PG-2 and second pull down transistor PD-2.

Compared to SRAM cell 1001, the first fin contact FinC1 of storage node SN is wider in the second direction X, which makes it possible to extend over both fin structures Fin1A and Fin1B. Similarly, compared to SRAM cell 1001, the second fin contact FinC2 of storage node SNB is wider, which makes it possible to extend over both fin structures Fin4A and Fin4B. SRAM cell 1101 has a pitch Y2 in the first direction Y direction and pitch X2 in the second direction X. In some embodiments, the ratio of X2 to Y2 is greater than or equal to 3. The pitch X2 in the second direction X is greater than the pitch X1 (FIG. 10) in SRAM cell 1001, because SRAM cell 1101 includes the multi-fin structure described above. In some embodiments, pitch X2 is at least 1.1 times pitch X1. Pitch Y2, however, is substantially equal to pitch Y1 (FIG. 10) of SRAM cell 1001. In some embodiments, pitch Y2 is optionally different from pitch Y1. In some embodiments, a ratio of the width of the first fin contact FinC1 of storage node SN included in SRAM cell 1101 to the width of the first fin contact FinC1 of storage node SN included in SRAM cell 1001 corresponds to the ratio of pitch X2 to pitch X1. For example, in some embodiments, the width of the first fin contact FinC1 of storage node SN included in SRAM cell 1101 is at least 1.1 times the width of the first fin contact FinC1 of storage node SN included in SRAM cell 1001. In some embodiments, the width of the first fin contact FinC1 of storage node SN included in SRAM cell 1101 is independent of the ratio of pitch X2 to pitch X1.

To increase the drive strength of the SRAM cell 1101, additional fin structures are optionally added in place of one or more of fin structures Fin1, Fin2, Fin3 or Fin4 of SRAM cell 1001. For example, SRAM cell 1101 is capable of including three, four or more fin structures in place of fin structures Fin1A and Fin1B, and/or fin structures Fin4A and Fin4B. In these alternative embodiments, pitch X2 is capable of being increased even further compared to pitch X1. In embodiments that include more than two fin structures in place of fin structure Fin1 and fin structure Fin4, the fin contacts FinC1 and FinC2 of storage nodes SN and SNB further extend beyond that which is shown in FIG. 11 to correspond to the added pitch between the fin structures, which makes it possible to couple the source and drain portions together so as to form the multi-fin finFET transistor.

Figure 12:
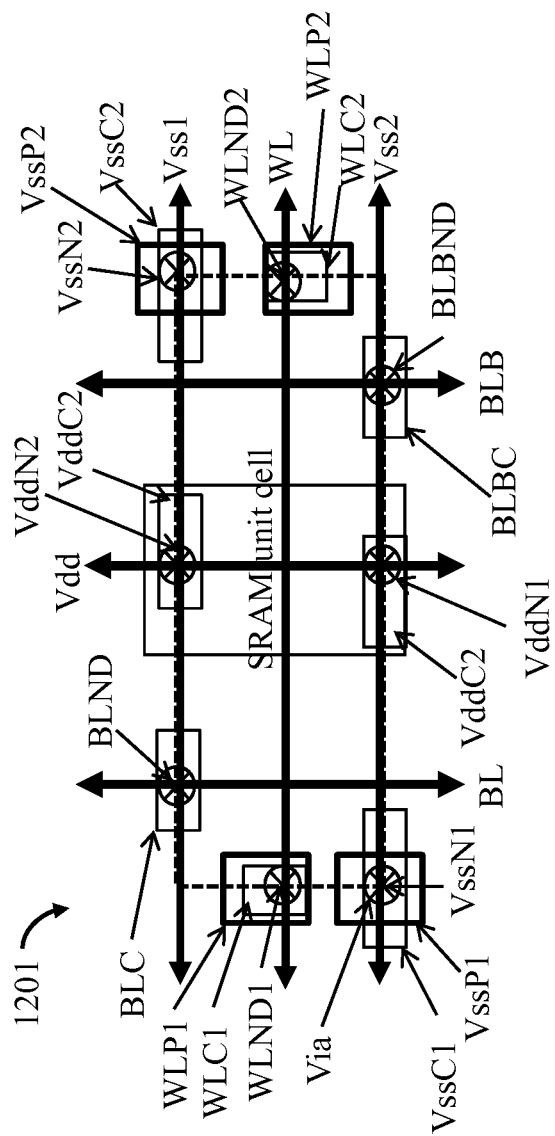
FIG. 12 is a high-level diagram of an SRAM cell, in accordance with one or more embodiments.

FIG. 12 is a high-level diagram of an SRAM cell 1201, in accordance with one or more embodiments. SRAM cell 1201 includes word line portion WL, bit line portion BL, complementary bit line portion BLB, connectivity to first voltage line Vss and connectivity to second voltage line Vdd, discussed with respect to the other SRAM cells discussed herein.

In SRAM cell 1201, word line portion WL is electrically connected to layers that are above or below the word line portion WL by way of word line portion landings pads WLP1 and WLP2, word line portion contacts WLC1 and WLC2, and corresponding vias at word line nodes WLND1 and WLND2, respectively. Bit line portion BL and complementary bit line portion BLB are electrically connected to layers that are above or below the bit line portion BL or the complementary bit line portion BLB by way of bit line contact BLC and complementary bit line contact BLBC and corresponding vias at bit line node BLND and complementary bit line node BLBND, respectively. SRAM cell 1201 includes first connector Vss1 and second connector Vss2 that are electrically connected to first voltage line Vss. In some embodiments, first connector Vss1 and second connector Vss2 comprise one or more electrically conductive materials that are electrically connected with first voltage line Vss. In some embodiments, first connector Vss1 and second connector Vss2 are conductive lines that are electrically connected with first voltage line Vss. In some embodiments, though described as connectors, first connector Vss1 and second connector Vss2 are individual voltage lines Vss. First connector Vss1 is electrically connected to layers that are above or below the first connector Vss1 by voltage landing pad VssP1, voltage contact VssC1 and at least one corresponding via at voltage node VssN1. Second connector Vss2 is electrically connected to layers that are above or below the second connector Vss2 by voltage landing pad VssP2, voltage contact VssC2, and at least one corresponding via at voltage node VssN2. Second voltage line Vdd is electrically connected to layers that are above of below the second voltage line Vdd by voltage contacts VddC1 and VddC2 and corresponding vias at voltage nodes VddN1 and VddN2.

Figure 13:
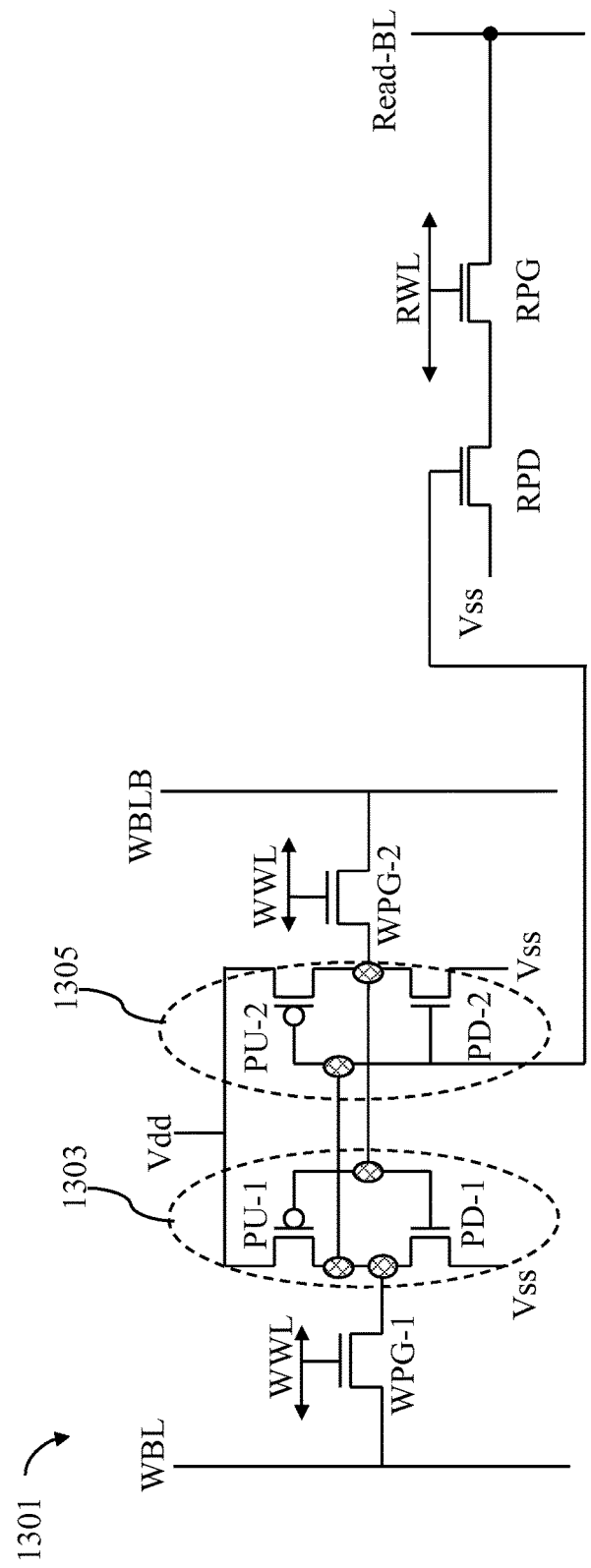
FIG. 13 is a circuit diagram of a two-port SRAM cell, in accordance with one or more embodiments.

FIG. 13 is a circuit diagram of a two-port SRAM cell 1301, in accordance with one or more embodiments. SRAM cell 1301 is usable as one of the SRAM cells included in the SRAM arrays discussed herein. In some embodiments, for example, SRAM cell 1301 is usable as one or more SRAM cells 401 (FIG. 4) included in two-port SRAM array 400 (FIG. 4).

SRAM cell 1301 comprises write bit line portion WBL, complementary write bit line portion WBLB, read bit line portion RBL, write word line portion WWL, read word line portion RWL, one or more connections to first voltage line Vss and second voltage line Vdd. SRAM cell 1301 also comprises a first inverter 1303, a second inverter 1305, a first write pass gate WPG-1, a second write pass gate WPG-2, a read pull down transistor RPD, and a read pass gate RPG.

First inverter 1303 comprises a first pull down transistor PD-1 and a first pull up transistor PU-1. In some embodiments, first pull down transistor PD-1 is an NMOS transistor and first pull up transistor PU-1 is a PMOS transistor. Second inverter 1305 comprises a second pull down transistor PD-2 and a second pull up transistor PU-2. In some embodiments, second pull down transistor PD-2 is an NMOS transistor and second pull up transistor PU-2 is a PMOS transistor. Each of the first pull up transistor PU-1, the second pull up transistor PU-2, the first pull down transistor PD-1 and the second pull-down transistor PD-2 comprise source/drain regions, a well region, and a gate electrode.

The second inverter 1305 is cross-coupled with the first inverter 1303. The drain of the second pull down transistor PD-2 and the drain of the second pull up transistor PU-2 are coupled with the gate of the first pull down transistor PD-1 and the gate of the first up transistor PU-1. The drain of the first pull down transistor PD-1 and the drain of the first pull up transistor PU-1 are coupled with the gate of the second pull down transistor PD-2 and the gate of the second pull up transistor PU-2.

The first write pass gate WPG-1 is coupled with the write bit line portion WBL, the write word line portion WWL, the drain of the first pull up transistor PU-1 and the drain of the first pull down transistor PD-1. The second write pass gate WPG-2 is coupled with the complementary write bit line portion WBLB, the write word line portion WWL, the drain of the second pull up transistor PU-2 and the drain of the second pull down transistor PD-2. The read pull down transistor RPD is coupled with the gate of the second pull up transistor PU-2, the second pull down transistor PD-2, the read pass gate RPG, and the first voltage line Vss. The read pass gate RPG is coupled with the read pull down transistor RPD, the read word line portion RWL, and the read bit line portion RBL.

In some embodiments, the first write pass gate WPG-1 and the second write pass gate WPG-2, the read pull down transistor RDP and the read pass gate transistor RPG are data storage and data read/write control transistors. Each the first write pass gate WPG-1, the second write pass gate WPG-2, the read pull down transistor RPD, and the read pass gate RPG comprise source/drain regions, a well region, and a gate electrode.

The source of the first pull up transistor PU-1 and the source of the second pull up transistor PU-2 are coupled with the second voltage line Vdd. The source of the first pull down transistor PD-1 and the source of the second pull down transistor PD-2 are coupled with the first voltage line Vss.

In some embodiments, the write bit line portion WBL, the complementary write bit line portion WBLB and the read bit line portion RBL are in a first layer on a first level of the SRAM cell 1301, and the write word line portion WWL and the read word line portion RWL are in a second layer of the SRAM cell 1301 on a second level different from the first level. In some embodiments, the second level is over the first level. In some embodiments, the SRAM cell 1301 includes two or more connections to first voltage line Vss and at least one connection to second voltage line Vdd.

In some embodiments, at least one of the two or more connections to first voltage line Vss is on a level of the SRAM cell 1301 different from a level on which another connection to first voltage line Vss is formed. Each connection to first voltage line Vss extends in the first direction Y and is substantially parallel to other connections to first voltage line Vss in the same or other levels of the SRAM cell 1301.

Figure 14:
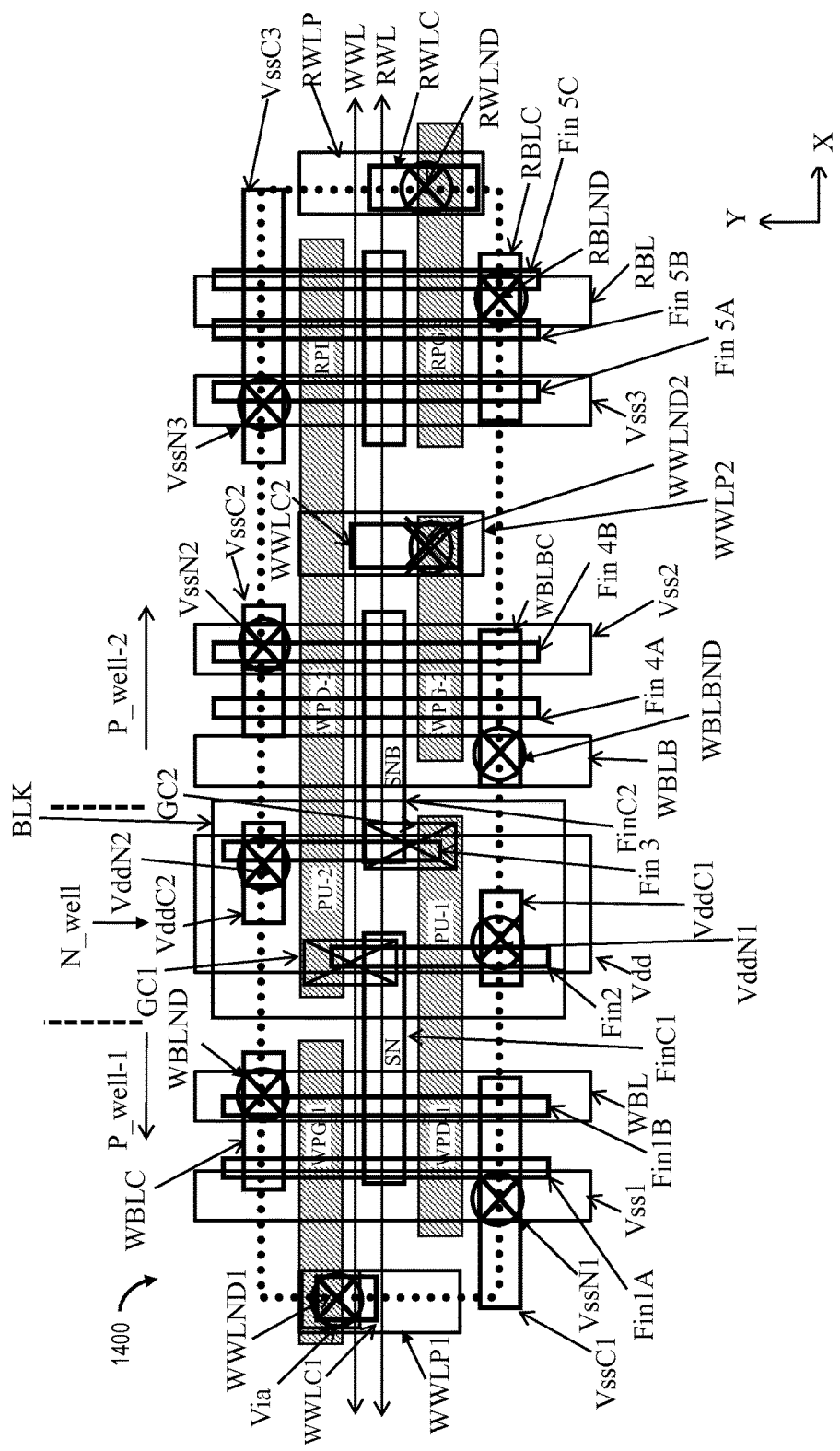
FIG. 14 is a layout of a two-port SRAM cell, in accordance with one or more embodiments.

FIG. 14 is a layout of a two-port SRAM cell 1401, in accordance with one or more embodiments. SRAM cell 1401 is an eight-transistor (8T) SRAM cell that is an example embodiment of two-port SRAM cell 1301 (FIG. 13). SRAM cell 1401 is described as a multi-finFET device. As such, FIG. 14 depicts the local interconnects, fin structures, and wells for an 8T SRAM cell using multi-fin finFET devices. SRAM cell 1401 includes many of the features discussed with respect to SRAM cell 1301. SRAM cell 1401 also includes semiconductor fin structures Fin1A, Fin1B, Fin2, Fin3, Fin4A, Fin4B, Fin5A, Fin5B and Fin 5C. SRAM cell 1401 includes vias in one or more layers that are over or under a corresponding contact or landing pad. Vias are illustrated as circular shapes with an "X" in the center. The vias extend vertically (into and out of the page) and are configured to provide connections between conductive layers on different levels of SRAM cell 1401.

Fin structures Fin1A, Fin1B are formed over P_well-1. Fin4A, Fin4B, Fin5A, Fin5B and Fin5C are P_well-2. Fin structures Fin2 and Fin3 are formed over the N_well region to provide the semiconductor region for the first pull up transistor PU-1 and the second pull up transistor PU-2. In some embodiments, the N_well region also provides a contact for the body or bulk terminal BLK for the first pull up transistor PU-1 and the second pull up transistor PU-2.

Fin structures Fin1A and Fin1B provide channel, source and drain regions for the first write pull down transistor WPD-1 and the first write pass gate WPG-1. Fin structure Fin2 provides channel, source and drain regions for the first pull up transistor PU-1. Fin structure Fin3 provides channel, source and drain regions for the second pull up transistor PU-2. Fin structures Fin4A and Fin4B provide channel, source and drain regions for the second write pull down transistor WPD-2 and the second write pass gate WPG-2. Fin structures Fin5A, Fin5B and Fin 5C provide channel, source and drain regions for the read pull down transistor RPD and the read pass gate RPG.

Gate material G, which forms the gate electrodes for each of the transistors PU-1, PU-2, WPD-1, WPD-2, WPG-1, WPG-2, RPD, and RPG, is over fin structures Fin1A, Fin1B, Fin2, Fin3, Fin4A, Fin4B, Fin5A, Fin5B and Fin 5C. The source and drain regions for transistors PU-1, PU-2, WPD-1, WPD-2, WPG-1, WPG-2, RPD and RPG are in the corresponding fin structures on opposite sides of the gate electrode of each corresponding transistor PU-1, PU-2, WPD-1, WPD-2, WPG-1, WPG-2, RPD and RPG. Fin structures Fin1A, Fin1B, Fin2, Fin3, Fin4A, Fin4B, Fin5A, Fin5B and Fin5C are configured as connection points to conductive features on levels of the SRAM cell 1401 that are above the fin structures Fin1A, Fin1B, Fin2, Fin3, Fin4A, Fin4B, Fin5A, Fin5B and Fin5C such as write bit line portion WBL, complementary write bit line portion WBLB, read bit line portion RBL, write word line portion WWL, read word line portion RWL, connectors Vss1/Vss2/Vss3 and second voltage line Vdd.

First write pass gate WPG-1 is electrically connected with write word line portion WWL at write word line node WWLND1 by way of fin structures Fin1A and Fin1B, write word line portion landing pad WWLP1, write word line portion contact WWLC1 and at least one via. Second write pass gate WPG-2 is electrically connected with write word line portion WWL at write word line node WWLND2 by way of fin structures Fin4A and Fin4B, write word line portion landing pad WWLP2, write word line portion contact WWLC2 and at least one via.

First write pass gate WPG-1 is electrically connected with write bit line portion WBL by way of fin structures Fin1A and Fin1B, write bit line portion contact WBLC and at least one via at write bit line node WBLND. Second write pass gate WPG-2 is electrically connected with complementary write bit line portion WBLB by way of fin structures Fin4A and Fin4B, complementary write bit line portion contact WBLBC and at least one via at complementary write bit line node WBLBND.

Read pass gate RPG is electrically connected with read word line portion RWL at read word line node RWLND by way of fin structures Fin5A, Fin5B and Fin 5C, read word line portion landing pad RWLP, read word line portion contact RWLC and at least one via. Read pass gate RPG is electrically connected with read bit line portion RBL by way of fin structures Fin5A, 5B and Fin5C, read bit line portion contact RBLC and at least one via at read bit line node RBLND.

First pull-up transistor PU-1 is electrically connected to second voltage line Vdd by way of fin structure Fin2, voltage contact VddC1 and at least one via at voltage node VddN1. Second pull-up transistor PU-2 is electrically connected to second voltage line Vdd by way of fin structure Fin3, voltage contact VddC2 and at least one via at voltage node VddN2.

First write pull-down transistor WPD-1 is electrically connected to first voltage line Vss by way of fin structures Fin1A and Fin1B, first connector Vss1, voltage contact VssC1 and at least one via at voltage node VssN1. Second write pull-down transistor WPD-2 is electrically connected to first voltage line Vss by way of fin structures Fin4A and Fin4B, second connector Vss2, voltage contact VssC2 and at least one via at voltage line node VssN2. Read pull-down transistor RPD is electrically connected to first voltage line Vss by way of fin structures Fin5A, Fin5B and Fin5C, third connector Vss3, voltage contact VssC3 and at least one via at voltage line node VssN3. Similar to first connector Vss1 and Vss2, in some embodiments, third connector Vss3 comprises one or more electrically conductive materials that are electrically connected with first voltage line Vss. In some embodiments, third connector Vss3 is a conductive line that is electrically connected with first voltage line Vss. In some embodiments, though described as a connector, third connector is an individual voltage line Vss.

The various contacts are configured to provide vertical connections between conductive features of the SRAM cell 1401 on different levels of the SRAM cell 1401. In some embodiments, some of the contacts are over one or more of the fin structures Fin1A, Fin 1B, Fin2, Fin3, Fin4A, Fin4B, Fin5A, Fin5B, or Fin5C, and some of the contacts are over the gate material G of one or more of transistors PU-1, PU-2, WPD-1, WPD-2, WPG-1, WPG-2, RPD, and RPG. Some of the contacts are configured to electrically connect elements of the SRAM cell 1401 that are on a same level. For example, fin structures Fin1A and Fin1B are coupled with fin structure Fin2 by a first fin contact FinC1. Similarly, fin structure Fin3 is coupled with fin structures Fin4A and Fin4B by a second fin contact FinC2. In some embodiments, one or more of first fin contact FinC1 is coupled with the gate of second pull up transistor PU-2 by way of a first gate contact GC1, or second fin contact FinC2 is coupled with the gate of first pull up transistor PU-1 by way of a second gate contact GC2.

First fin contact FinC1 and first gate contact GC1 together couple the gate of second pull up transistor PU-2 with the source/drain regions of first pull up transistor PU-1 (i.e., fin structure Fin2) and the source/drain regions of first write pull down transistor WPD-1 (i.e., fin structures Fin1A and Fin1B), forming storage node SN. Similarly, second fin contact FinC2 and second gate contact GC2 together couple the gate of first pull up transistor PU-1 with the source/drain regions of second pull up transistor PU-2 (i.e., fin structure Fin3) and the source/drain regions of second write pull down transistor WPD-2 (i.e., fin structures Fin4A and Fin4B), forming storage node SNB.

To increase or decrease the drive strength of the SRAM cell 1401, additional fin structures are optionally added to SRAM cell 1401 or removed from SRAM cell 1401. Similar to SRAM cell 1101, adding fin structures increases the pitch of the SRAM cell in the second direction X, while removing fin structures decreases the pitch of the SRAM cell in the X direction.

Figure 15:
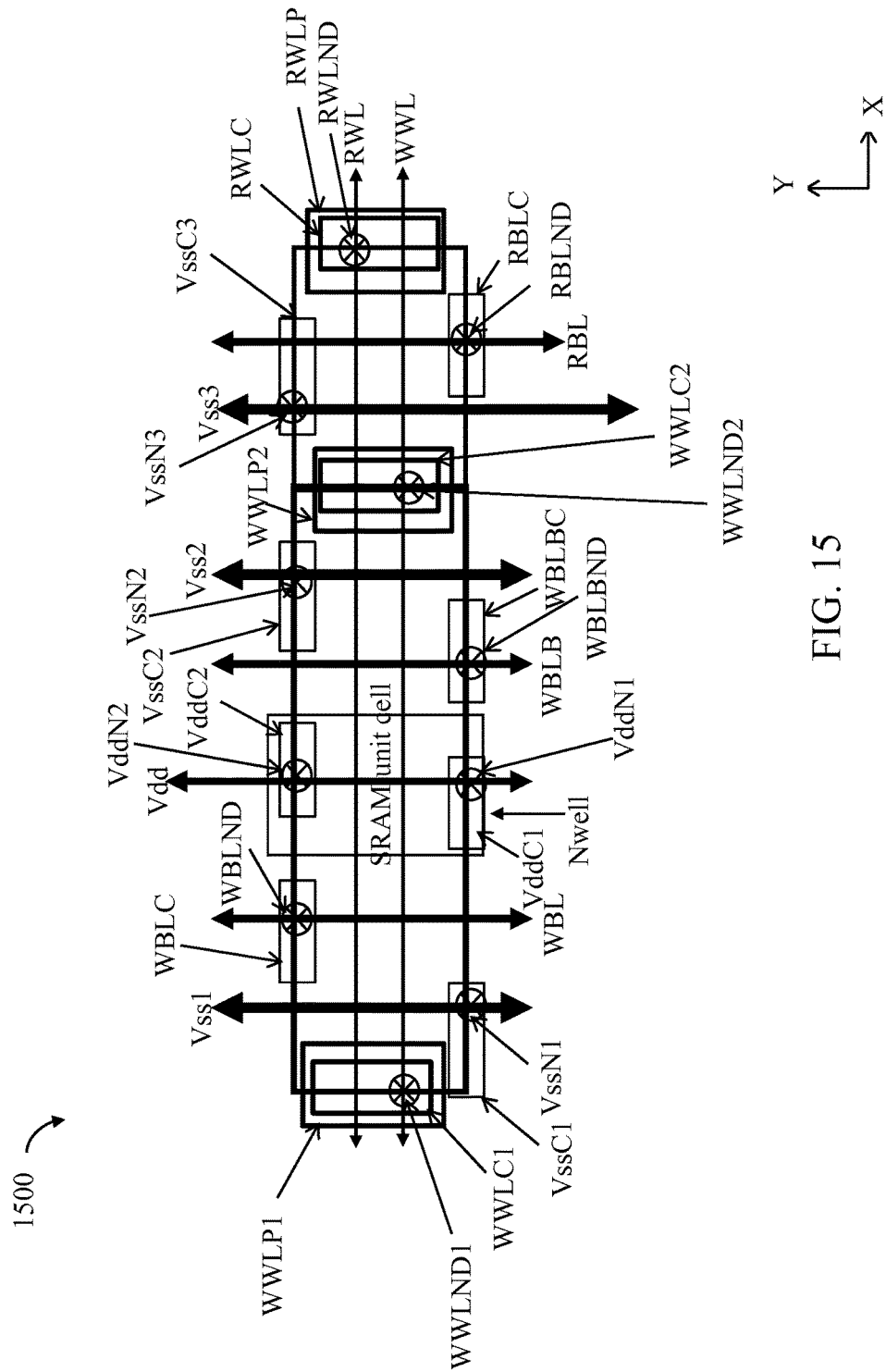
FIG. 15 is a high-level diagram of a two-port SRAM cell, in accordance with one or more embodiments.

FIG. 15 is a high-level diagram of a two-port SRAM cell 1501, in accordance with one or more embodiments. SRAM cell 1501 includes the read word line portion RWL, read bit line portion RBL, write bit line portion WBL, complementary write bit line portion WBLB, connectivity to first voltage line Vss and connectivity to second voltage line Vdd, discussed with respect to the other SRAM cells discussed herein.

In SRAM cell 1501, write word line portion WWL is electrically connected to layers that are above or below the write word line portion WWL by way of write word line portion landing pads WWLP1 and WWLP2, write word line portion contacts WWLC1 and WWLC2, and corresponding vias at write word line nodes WWLND1 and WWLND2, respectively. Read word line portion RWL is electrically connected to layers that are above or below the read word line portion RWL by way of read word line landing pad RWLP, read word line portion contact RWLC, and at least one corresponding via at read word line node RWLND. Write bit line portion WBL is electrically connected to layers that are above or below the write bit line portion WBL by way of write bit line contact WBLC and at least one corresponding via at write bit line node WBLND. Complementary write bit line portion WBLB is electrically connected to layers that are above or below the complementary write bit line portion WBLB by way of complementary write bit line contact WBLBC and at least one corresponding via at complementary write bit line node WBLBND. Read bit line portion RBL is electrically connected to layers that are above or below the read bit line portion RBL by way of read bit line contact RBLC and at least one corresponding via at read bit line node RBLND.

SRAM cell 1501 includes first connector Vss1, second connector Vss2, and third connector Vss3 that are electrically connected to first voltage line Vss. First connector Vss1, second connector Vss2, and third connector Vss3 extend in the first direction Y. First connector Vss1 is electrically connected to layers that are above or below the first connector Vss1 by way of voltage contact VssC1 and at least one corresponding via at voltage node VssN1. Second connector Vss2 is electrically connected to layers that are above or below the second connector Vss2 by way of voltage contact VssC2, and at least one corresponding via at voltage node VssN2. Third connector Vss3 is electrically connected to layers that are above or below the third connector Vss3 by way of voltage contact VssC3, and at least one corresponding via at voltage node VssN3. Second voltage line Vdd is electrically connected to layers that are above of below the second voltage line Vdd by way of voltage contacts VddC1 and VddC2 and corresponding vias at voltage nodes VddN1 and VddN2.

Figure 16:
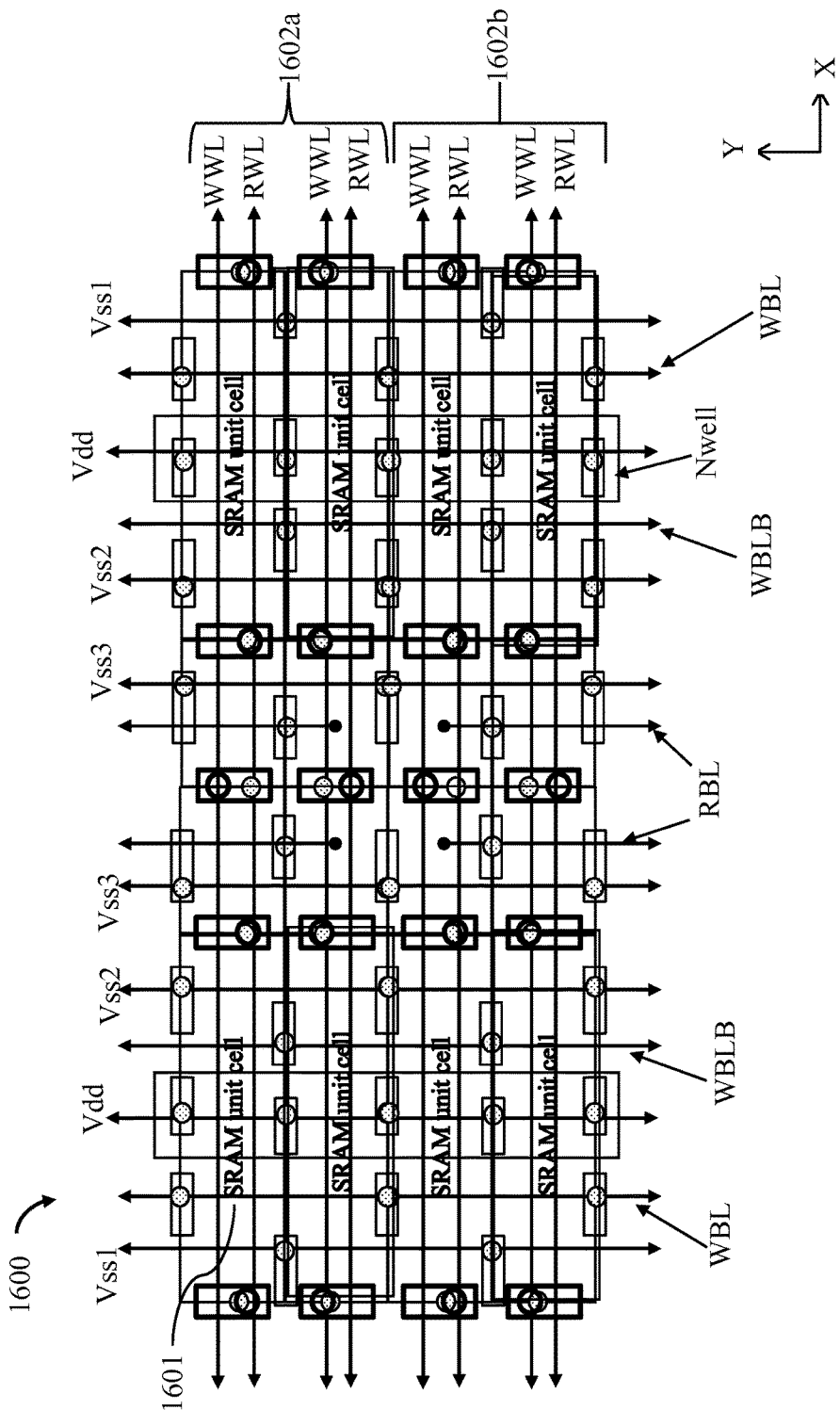
FIG. 16 is a high-level view of an SRAM array, in accordance with one or more embodiments.

FIG. 16 is a high-level view of an SRAM array 1600, in accordance with one or more embodiments. SRAM array 1600 is a 2×4 SRAM array that is an example of abutting two-port SRAM cells 1601 that have separated read bit line portions RBL between sub-arrays 1602a and 1602b. SRAM cells 1601 are similar to SRAM cell 1501 (FIG. 15), with the exception of abutting SRAM cells 1601 that have separated read bit line portions RBL. The layouts of the SRAM cells 1601 included in SRAM array 1600 are substantially identical to one another, with the exception of the SRAM cells 1601 included in sub-array 1602a and the SRAM cells 1601 included in sub-array 1602b that abut one another. The abutting SRAM cells 1601 between sub-arrays 1602a/1602b have a disconnect in the metal layer associated with the read bit line portion RBL. The write bit line portions WBL, the complementary write bit line portions WBLB, the write word line portions WWL and the read word line portions RWL of the SRAM cells 1601 included in sub-array 1602a and 1602b are electrically connected as discussed above.

Figure 17:
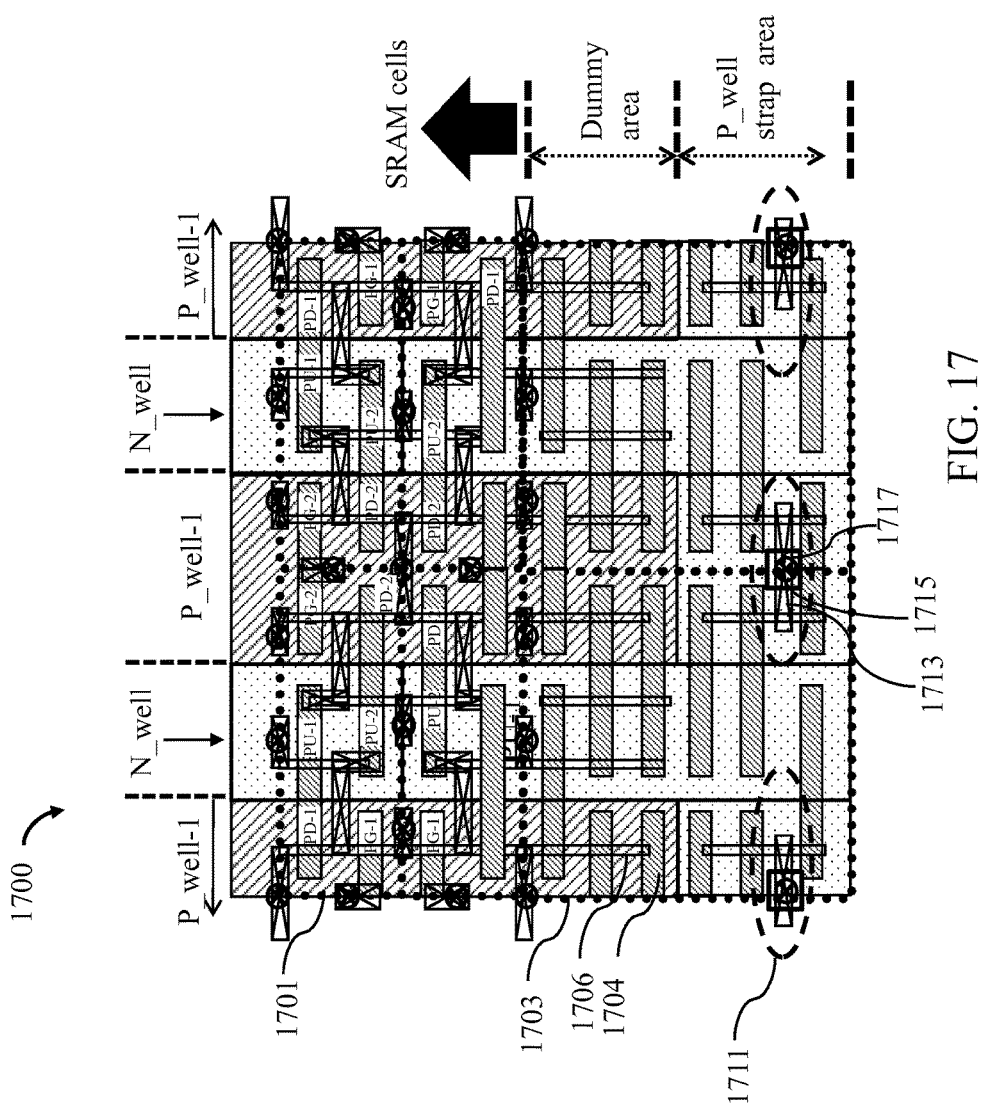
FIG. 17 is a layout view of an SRAM array with columns of SRAM cells having a row of first-type strap cells at an end of the columns of SRAMS cells, in accordance with one or more embodiments.

FIG. 17 is a layout view of an SRAM array 1700 with columns of SRAM cells 1701 having a row of first-type strap cells 1703 at an end of the columns of SRAMS cells 1701, in accordance with one or more embodiments. The SRAM cells 1701 are similar to SRAM cell 801 (FIG. 8), but are capable of being replaced by any of the SRAM cells discussed herein. First-type strap cells 1703 comprise a P_well strap area and a dummy area. The P_well strap area and the dummy area include gate electrodes 1704. For simplicity, only one gate electrode 1704 is labeled. In some embodiments, the gate electrodes 1704 comprise gate material G used to form the gate electrodes of the transistors included in the SRAM cells 1701.

The P_well strap area and the dummy area include semiconductor fin structures 1706. For simplicity, only one fin structure 1706 is labeled. Fin structures 1706 are similar to fin structures Fin1, Fin2, Fin3, Fin4 and Fin5 (FIGS. 10, 11 and 14). For example, fin structures 1706 are configured as connection points to conductive features on levels of the first-type strap cells 1703 that are above fin structures 1706. First-type strap cells 1703 and SRAM cells 1701 are electrically connected. In some embodiments, first-type strap cells 1703 abut SRAM cells 1701 such that some of the fin structures 1706 are electrically connected with one or more of the fin structures included in SRAM cells 1701. In some embodiments, fin structures 1706 are electrically coupled with one or more of the fin structures included in SRAM cells 1701 by way of an electrical connector that comprises one or more of an electrically conductive material, a conductive line, or some other suitable coupling (not shown). First-type strap cells 1703 are configured to help to uniformly distribute charge throughout SRAM array 1700. In some embodiments, gate electrodes 1704 are dummy gate electrodes that connect some of fin structures 1706 in a same first-type strap cell 1703 to help with the uniform charge distribution throughout SRAM array 1700. In some embodiments, the first-type strap cells 1703 each comprise at least six dummy gate electrodes 1704 to facilitate uniform charge distribution.

The P_well strap area includes P-type well strap structures 1711 that are positioned over the P_well regions of the SRAM array 1700. Each first-type strap cell 1703 is free from including an N-type well strap structure. In some embodiments, the P-type well strap structures 1711 are formed over P-type oxide definition regions that are over the P_well regions. In some embodiments, the P-type oxide definition region comprises silicon-germanium. In some embodiments, the SRAM array 1700 is formed over a silicon substrate, and the silicon-germanium is epitaxially grown over the P_well regions over the silicon substrate.

The P-type well strap structures 1711 are configured to electrically connect the P_well of the first-type strap cell 1703 with the first voltage line Vss (FIG. 8) to help with the uniform charge distribution through SRAM array 1700. Each P-type well strap structure 1711 comprises a first group contact layer 1713, a first via layer 1715, and a first conductive layer 1717 electrically connected to first voltage line Vss. The first group contact layer 1713 is electrically connected with the first voltage line Vss by way of the first via layer 1715 and the first conductive layer 1717. In some embodiments, one or more of the first via layer 1715 or the first conductive layer 1717 is omitted, and the first group contact layer 1713 is directly electrically connected with the first voltage line Vss or the first group contact layer 1713 is connected with the first voltage line by way of the first via layer 1715. In some embodiments, the first conductive layer 1717 comprises a single layer. In other embodiments, the first conductive layer 1717 comprises multiple layers.

At least some of the fin structures 1706 are coupled with one another by the first group contact layer 1713 of at least one of the P-type well strap structures 1711. In some embodiments, the fin structures 1706 that are coupled with one another by the first group contact layer 1713 of the at least one P-type well strap structure 1711 are in adjacent first-type strap cells 1703, and fin structures 1706 included in a same first-type strap cell 1703 are not coupled with one another by the first group contact layer 1713 of the at least one P-type well strap structure 1711. By coupling at least some of the fin structures 1706 with one another by way of at least one P-type well strap structure, the P_well of the first-type strap cell 1703 is electrically connected with the first voltage line Vss. For example, the P_well of the first-type strap cell 1703 is coupled with the first voltage line Vss by way of the fin structures 1706 included in the P_well strap area, and one or more of the first group contact layer 1713, via layer 1715, or first conductive layer 1717.

Figure 18:
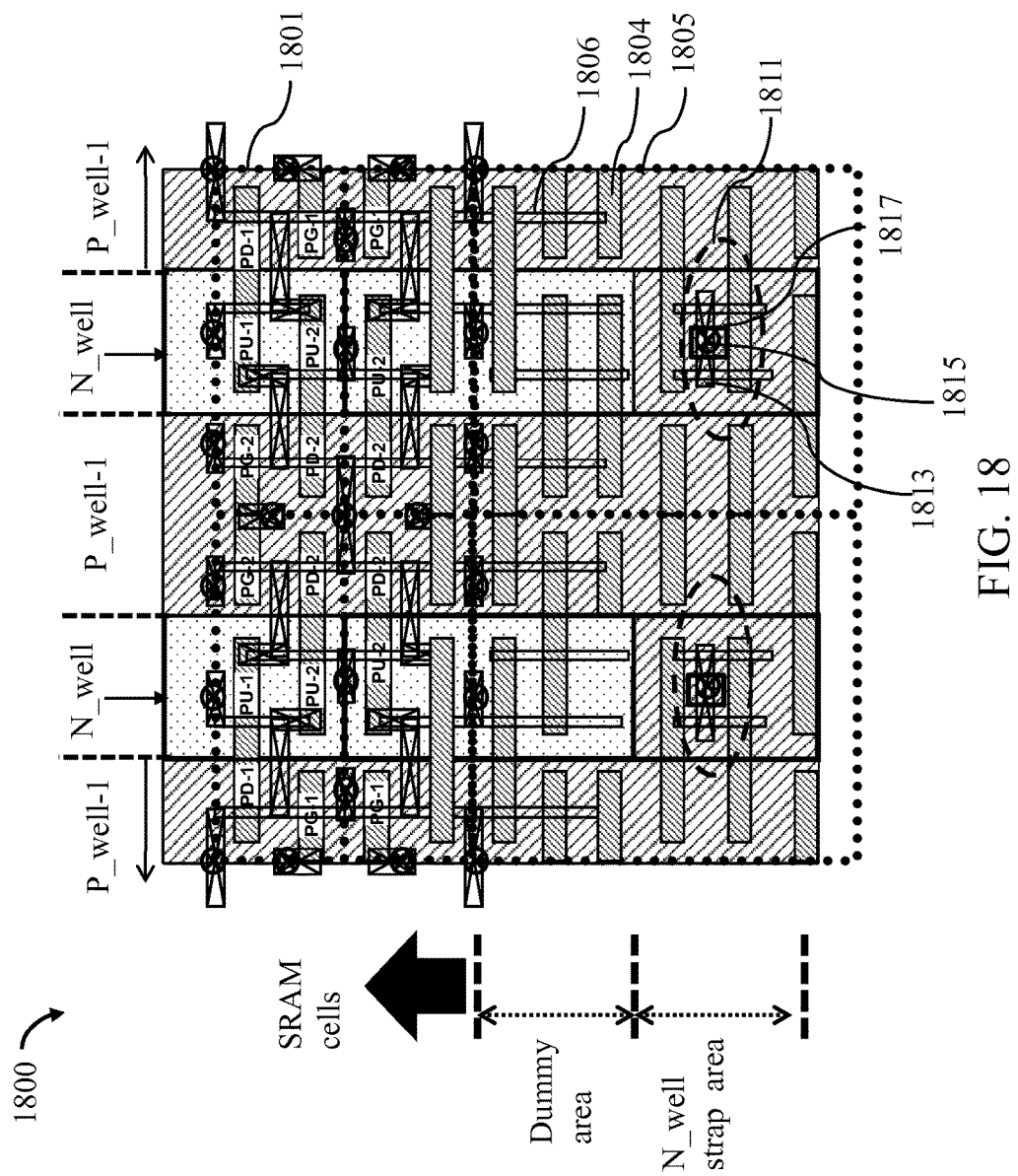
FIG. 18 is a layout view of an SRAM array with columns of SRAM cells having a row of second-type strap cells at an end of the columns of SRAMS cells, in accordance with one or more embodiments.

FIG. 18 is a layout view of an SRAM array 1800 with columns of SRAM cells 1801 having a row of second-type strap cells 1805 at an end of the columns of SRAMS cells 1801, in accordance with one or more embodiments. The SRAM cells 1801 are similar to SRAM cells 801 (FIG. 8), but are capable of being replaced by any of the SRAM cells discussed herein. Second-type strap cells 1803 comprise an N_well strap area and a dummy area. The N_well strap area and the dummy area include gate electrodes 1804. For simplicity, only one gate electrode 1804 is labeled. In some embodiments, the gate electrodes 1804 comprise gate material G used to form the gate electrodes of the transistors included in the SRAM cells 1801.

The N_well strap area and the dummy area include semiconductor fin structures 1806. For simplicity, only one fin structure 1806 is labeled. Fin structures 1806 are similar to fin structures Fin1, Fin2, Fin3, Fin4 and Fin5 (FIGS. 10, 11 and 14). For example, fin structures 1806 are configured as connection points to conductive features on levels of the second-type strap cells 1803 that are above fin structures 1806. Strap cells 1805 and SRAM cells 1801 are electrically connected. In some embodiments, strap cells 1805 abut SRAM cells 1801 such that some of the fin structures 1806 are electrically connected with one or more of the fin structures included in SRAM cells 1801. In some embodiments, fin structures 1806 are electrically coupled with one or more of the fin structures included in SRAM cells 1801 by way of an electrical connector that comprises one or more of an electrically conductive material, a conductive line, or some other suitable coupling (not shown). Second-type strap cells 1803 are configured to help to uniformly distribute charge throughout SRAM array 1800. In some embodiments, gate electrodes 1804 are dummy gate electrodes that connect some of fin structures 1806 in a same second-type strap cell 1803 to help with the uniform charge distribution throughout SRAM array 1800. In some embodiments, the second-type strap cells 1803 each comprise at least six dummy gate electrodes 1804 to facilitate uniform charge distribution.

The N_well strap area includes N-type well strap structures 1811 that are positioned over the N_well regions of the SRAM array 1800. Each second-type strap cell 1803 is free from including a P-type well strap structure. In some embodiments, the N-type well strap structures 1811 are formed over N-type oxide definition regions that are over the N_well regions. In some embodiments, the N-type oxide definition region comprises silicon-phosphate. In some embodiments, the SRAM array 1800 is formed over a silicon substrate, and the silicon-phosphate is epitaxially grown over the N_well regions over the silicon substrate.

The N-type well strap structures 1811 are configured to electrically connect the N_well of the second-type strap cell 1803 with the second voltage line Vdd (FIG. 8) to help with the uniform charge distribution through SRAM array 1800. Each N-type well strap structure 1811 comprises a second group contact layer 1813, a second via layer 1815, and a second conductive layer 1817 electrically connected to second voltage line Vdd. The second group contact layer 1813 is electrically connected with the second voltage line Vdd by way of the second via layer 1815 and the second conductive layer 1817. In some embodiments, one or more of the second via layer 1815 or the second conductive layer 1817 is omitted, and the second group contact layer 1813 is directly electrically connected with the second voltage line Vdd or the second group contact layer 1813 is connected with the second voltage line Vdd by way of the second via layer 1815. In some embodiments, the second conductive layer 1817 comprises a single layer. In other embodiments, the second conductive layer 1817 comprises multiple layers.

At least some of the fin structures 1806 are coupled with one another by the second group contact layer 1813 of at least one of the N-type well strap structures 1811. In some embodiments, the fin structures 1806 that are coupled with one another by the second group contact layer 1813 of the at least one N-type well strap structure 1811 are in adjacent second-type strap cells 1803, and fin structures 1806 included in a same second-type strap cell 1803 are not coupled with one another by the second group contact layer 1813 of the at least one N-type well strap structure 1811. By coupling at least some of the fin structures 1806 with one another by way of at least one N-type well strap structure, the N_well of the second-type strap cell 1803 is electrically connected with the second voltage line Vdd. For example, the N_well of the second-type strap cell 1803 is coupled with the second voltage line Vdd by way of the fin structures 1806 included in the N_well strap area, and one or more of the second group contact layer 1813, second via layer 1815, or second conductive layer 1817.

Figure 19:
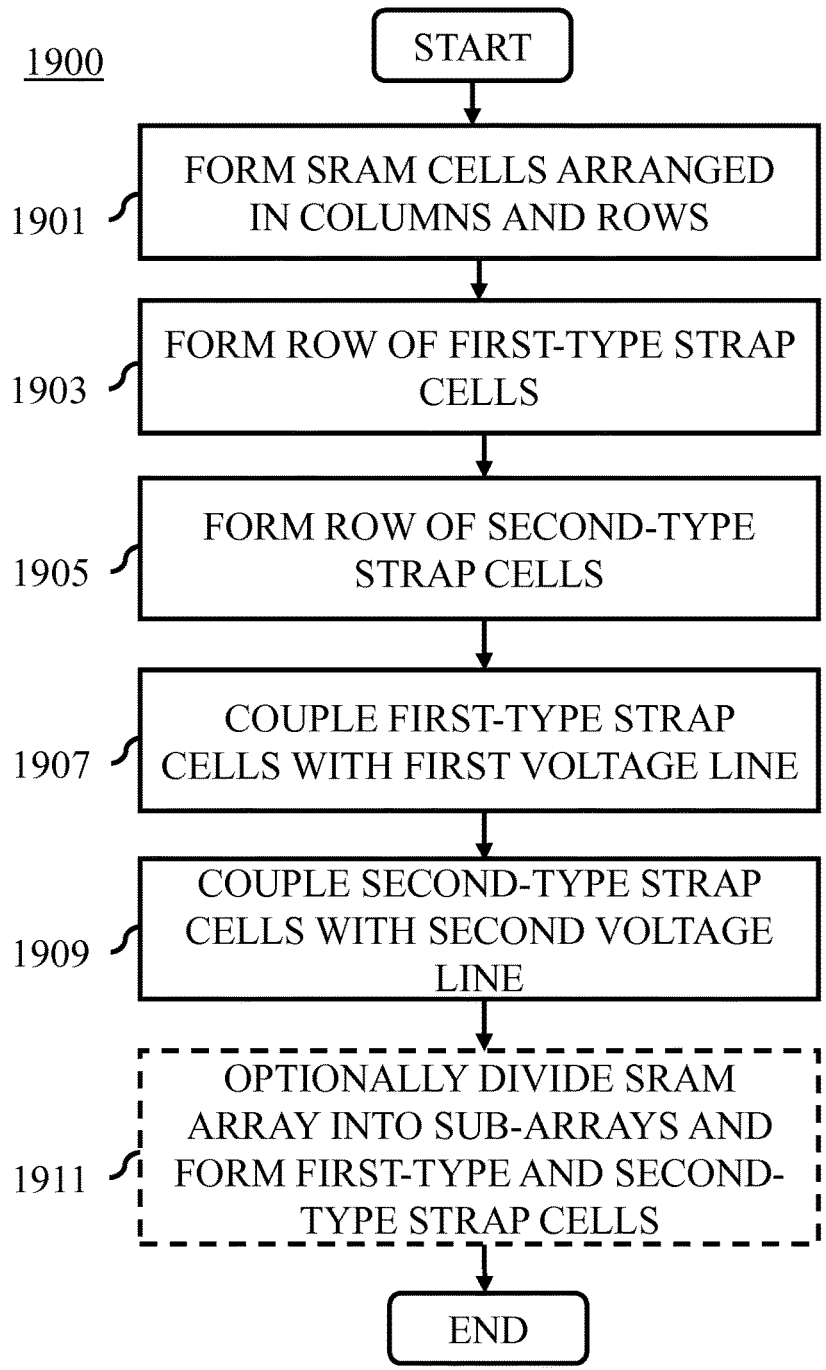
FIG. 19 is a method of forming an SRAM array having strap cells, in accordance with one or more embodiments.

FIG. 19 is a method 1900 of forming an SRAM array having strap cells, in accordance with one or more embodiments. In step 1901 a plurality of SRAM cells are formed over a substrate. The plurality of SRAM cells are arranged in columns and rows. In step 1903, a row of first-type strap cells are formed over the substrate abutting a first end of the columns of SRAM cells of the plurality of SRAM cells. In step 1905, a row of second-type strap cells are formed abutting a second end of the columns of SRAM cells opposite the first end. The first-type strap cells are free from including well contacts associated with the second-type strap cells. The second-type strap cells are free from including well contacts associated with the first-type strap cells. In step 1907, the first-type strap cells are coupled with a first voltage line. In step 1909, the second-type strap cells are coupled with a second voltage line. In steps 1911, the SRAM array is optionally divided into two or more sub-arrays, and the rows of first-type and second-type strap cells are optionally formed at one or more ends of columns of the two- or more sub-arrays of the SRAM array.

An aspect of this description is related to a memory array comprising a plurality of memory cells arranged in columns and rows. The columns of memory cells are arranged in a first direction, and the rows of memory cells are arranged in a second direction different from the first direction. Each memory cell of the plurality of memory cells comprises a bit line portion extending in the first direction, a complementary bit line portion extending in the first direction, a word line portion extending in the second direction, at least one connection to a first voltage line, and at least one connection to a second voltage line. The bit line portion is coupled with a bit line portion of an adjacent memory cell. The complementary bit line portion is coupled with a complementary bit line portion of the adjacent memory cell. The word line portion is coupled with a word line portion of another adjacent memory cell. The memory array also comprises a plurality of first-type strap cells arranged in a row substantially parallel to at least one of the word line portions of the memory cells. Each first-type strap cell comprises a first type well strap structure. The first-type well strap structure is configured to electrically connect a first-type well of the first-type strap cell with a first voltage connector electrically coupled with the first voltage line. The memory array further comprises a plurality of second-type strap cells arranged in a row substantially parallel to the at least one word line portion or at least one other word line portion. Each second-type strap cell comprises a second-type well strap structure. The second-type well strap structure is configured to electrically connect a second-type well of the second-type strap cell with a second voltage connector electrically coupled with the second voltage line. Each column of memory cells of the columns of memory cells is bracketed by at least one first-type strap cell of the plurality of first-type strap cells or at least one second-type strap cell of the plurality of second-type strap cells.

Another aspect of this description is related to a two-port static-random access memory (SRAM) array comprising a plurality of SRAM cells arranged in columns and rows. The columns of SRAM cells are arranged in a first direction. The rows of SRAM cells are arranged in a second direction different from the first direction. Each SRAM cell of the plurality of SRAM cells comprises a write bit line portion extending in the first direction, a complementary write bit line portion extending in the first direction, a read bit line portion extending in the first direction, a write word line portion extending in the second direction, a read word line portion extending in the second direction, at least one connection to a first voltage line, and at least one connection to a second voltage line. The write bit line portion is coupled with a write bit line portion of an adjacent SRAM cell. The complementary write bit line portion is coupled with a complementary write bit line portion of the adjacent SRAM cell. The read bit line portion is coupled with a read bit line portion of the adjacent SRAM cell. The write word line portion is coupled with a write word line portion of another adjacent SRAM cell. The read word line portion is coupled with a read word line portion of the another adjacent SRAM cell. The SRAM array also comprises a plurality of first-type strap cells arranged in a row substantially parallel to at least one of the read word line portions of the SRAM cells or at least one of the write word line portions of the SRAM cells. Each first-type strap cell comprises a P-type well strap structure. The P-type well strap structure is configured to electrically connect a P-type well of the first-type strap cell with a first voltage connector electrically coupled with the first voltage line. The SRAM array further comprises a plurality of second-type strap cells arranged in a row substantially parallel to the read word line portion of the SRAM cells or the at least one write word line portion of the SRAM cells. Each second-type strap cell comprises an N-type well strap structure. The N-type well strap structure is configured to electrically connect an N-type well of the second-type strap cell with a second voltage connector electrically coupled with the second voltage line. Each column of SRAM cells of the columns of SRAM cells is bracketed by one first-type strap cell of the plurality of first-type strap cells or one second-type strap cell of the plurality of second-type strap cells.

A further aspect of this description is related to a two-port static-random access memory (SRAM) array comprising a plurality of SRAM cells arranged in columns and rows. The columns of SRAM cells are arranged in a first direction. The rows of SRAM cells are arranged in a second direction different from the first direction. Each SRAM cell of the plurality of SRAM cells comprises a write bit line portion extending in the first direction, a complementary write bit line portion extending in the first direction, a read bit line portion extending in the first direction, a write word line portion extending in the second direction, a read word line portion extending in the second direction, at least one connection to a first voltage line, and at least one connection to a second voltage line. The write bit line portion is coupled with a write bit line portion of an adjacent SRAM cell. The complementary write bit line portion is coupled with a complementary write bit line portion of the adjacent SRAM cell. The read bit line portion is coupled with a read bit line portion of the adjacent SRAM cell. The write word line portion is coupled with a write word line portion of another adjacent SRAM cell. The read word line portion is coupled with a read word line portion of the another adjacent SRAM cell. The SRAM array also comprises a plurality of first-type strap cells arranged in a row substantially parallel to at least one of the read word line portions of the SRAM cells or at least of the one write word line portions of the SRAM cells of the SRAM cells. Each first-type strap cell comprises a P-type well strap structure. The P-type well strap structure is configured to electrically connect a P-type well of the first-type strap cell with a first voltage connector electrically coupled with the first voltage line. The SRAM array further comprises a plurality of second-type strap cells arranged in a row substantially parallel to the at least one read word line portion of the SRAM cells or the at least one write word line portion of the SRAM cells. Each second-type strap cell comprises an N-type well strap structure. The N-type well strap structure is configured to electrically connect an N-type well of the second-type strap cell with a second voltage connector electrically coupled with the second voltage line. Each column of SRAM cells is bracketed by one first-type strap cell of the plurality of first-type strap cells or one second-type strap cell of the plurality of second-type strap cells.

The SRAM cells of the plurality of SRAM cells are divided into a first sub-array having a first set of SRAM cells of the plurality of SRAM cells, a second sub-array having a second set of SRAM cells of the plurality of SRAM cells, a third sub-array having a third set of SRAM cells of the plurality of SRAM cells, and a fourth sub-array having a fourth set of SRAM cells of the plurality of SRAM cells. The first sub-array abuts the second sub-array. The third sub-array abuts the fourth sub-array. The write bit line portions of the SRAM cells of the first sub-array arranged in the at least one first column are electrically connected with the write bit line portions of the SRAM cells of the second sub-array arranged in the at least one second column. The complementary write bit line portions of the SRAM cells of the first sub-array arranged in the at least one first column are electrically connected with the complementary write bit line portions of the SRAM cells of the second sub-array arranged in the at least one second column. The write bit line portions of the SRAM cells of the third sub-array arranged in the at least one third column are electrically connected with the write bit line portions of the SRAM cells of the fourth sub-array arranged in the at least one fourth column. The complementary write bit line portions of the SRAM cells of the third sub-array arranged in the at least one third column are electrically connected with the complementary write bit line portions of the SRAM cells of the fourth sub-array arranged in the at least one fourth column. The read bit line portions of the SRAM cells of the first sub-array arranged in the at least one first column are physically separated from the read bit line portions of the SRAM cells of the second sub-array arranged in the at least one second column. The read bit line portions of the SRAM cells of the third sub-array arranged in the at least one third column are physically separated from the read bit line portions of the SRAM cells of the fourth sub-array arranged in the at least one fourth column.

The foregoing outlines features of several embodiments so that those skilled in the art may better understand the aspects of the present disclosure. While a number of embodiments and implementations have been described, the disclosure is not so limited. Rather, the disclosure covers various obvious modifications and equivalent arrangements, which fall within the purview of the appended claims. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Although features or steps of various embodiments are expressed in certain combinations among the claims, it is contemplated that these features or steps can be arranged in any combination or order, performed simultaneously, optionally omitted, and/or have other features or steps added thereto.

What is claimed is:

1. A memory array, comprising:
a plurality of memory cells arranged in columns and rows, the columns of memory cells are arranged in a first direction, the rows of memory cells are arranged in a second direction different from the first direction, each memory cell of the plurality of memory cells comprises:
a bit line portion extending in the first direction, the bit line portion is coupled with a bit line portion of an adjacent memory cell;
a complementary bit line portion extending in the first direction, the complementary bit line portion is coupled with a complementary bit line portion of the adjacent memory cell;
a word line portion extending in the second direction, the word line portion is coupled with a word line portion of another adjacent memory cell;
at least one connection to a first voltage line; and
at least one connection to a second voltage line;
a plurality of first-type strap cells arranged in a row substantially parallel to at least one of the word line portions of the memory cells, wherein each first-type strap cell comprises a first-type well strap structure, and the first-type well strap structure is configured to electrically connect a first-type well of the first-type strap cell with a first voltage connector electrically coupled with the first voltage line; and
a plurality of second-type strap cells arranged in a row substantially parallel to the at least one word line portion or at least one other word line portion, wherein each second-type strap cell comprises a second-type well strap structure, and the second-type well strap structure is configured to electrically connect a second-type well of the second-type strap cell with a second voltage connector electrically coupled with the second voltage line,
wherein each column of memory cells of the array of memory cells is bracketed by at least one first-type strap cell of the plurality of first-type strap cells at a first end of the column and at least one second-type strap cell of the plurality of second-type strap cells at a second end of the column opposite the first end of the column.

2. The memory array of claim 1, wherein
the first-type well strap structure is a P-type well strap structure, each P-type well strap structure comprises:
a first contact layer;
a first via layer; and
a first conductive layer, and
the P-type well strap structure is positioned over a P-type oxide definition region positioned over the P-type well.

3. The memory array of claim 2, wherein the second-type well strap structure is an N-type well strap structure, each N-type well strap structure comprises:
a second contact layer;
a second via layer; and
a second conductive layer, and
the N-type well strap structure is positioned over a N-type oxide definition region positioned over the N-type well.

4. The memory array of claim 3, wherein the N-type oxide definition region comprises silicon-phosphate.

5. The memory away of claim 1, wherein each first-type strap cell is free from including a second-type well strap structure and each second-type strap cell is free from including a first-type well strap structure.

6. The memory array of claim 1, wherein the memory cells of the plurality of memory cells are arranged in the columns of memory cells having a cell pitch in the first direction, and the strap cells of the plurality of strap cells have a cell height in the first direction equal to about three times the cell pitch.

7. The memory array of claim 1, wherein
the memory cells of the plurality of memory cells are divided into a first sub-array having a first set of memory cells of the plurality of memory cells and a second sub-array having a second set of memory cells of the plurality of memory cells,
the memory array further comprises at least one row of dummy cells, a quantity of the dummy cells of the row of dummy cells is equal to a quantity of columns of memory cells included in the first sub-array of memory cells, and the dummy cells of the row of dummy cells are arranged in the second direction to substantially align with the columns of memory cells included in the first sub-array,
the row of dummy cells is positioned between the first sub-array and the second sub-array,
the bit line portions of the memory cells of the first sub-array are physically separated from the bit line portions of the memory cells of the second sub-array, and
the complementary bit line portions of the memory cells of the first sub-array are physically separated from the complementary bit line portions of the memory cells of the second sub-array.

8. The memory array of claim 7, wherein the dummy cells are one of the first-type strap cell or the second-type strap cell.

9. The memory array of claim 1, wherein
the memory cells of the plurality of memory cells are divided into a first sub-array having a first set of memory cells of the plurality of memory cells and a second sub-array having a second set of memory cells of the plurality of memory cells,
the memory array further comprises a second plurality of first-type strap cells arranged in a row substantially parallel to at least one of the word line portions of the memory cells or at least one other word line portion of the memory cells,
one first-type strap cell of the plurality of first-type strap cells is on a first end of each column of memory cells,
one first-type strap cell of the second plurality of first-type strap cells is on a second end of each column of memory cells opposite the first end, and
the second-type strap cell of each column of memory cells is positioned between the first sub-array and the second sub-array.

10. The memory array of claim 1, wherein at least one column of memory cells has at least one dummy cell in the at least one column.

11. A two-port static random access memory (SRAM) array, comprising:

a plurality of SRAM cells arranged in columns and rows, the columns of SRAM cells are arranged in a first direction, the rows of SRAM cells are arranged in a second direction different from the first direction, each SRAM cell of the plurality of SRAM cells comprises:
a write bit line portion extending in the first direction, the write bit line portion is coupled with a write bit line portion of an adjacent SRAM cell;
a complementary write bit line portion extending in the first direction, the complementary write bit line portion is coupled with a complementary write bit line portion of the adjacent SRAM cell;
a read bit line portion extending in the first direction, the read bit line portion is coupled with a read bit line portion of the adjacent SRAM cell;
a write word line portion extending in the second direction, the write word line portion is coupled with a write word line portion of another adjacent SRAM cell;
a read word line portion extending in the second direction, the read word line portion is coupled with a read word line portion of the another adjacent SRAM cell;
at least one connection to a first voltage line; and
at least one connection to a second voltage line;
a plurality of first-type strap cells arranged in a first row substantially parallel to at least one of the read word line portions of the SRAM cells or at least one of the write word line portions of the SRAM cells, wherein each first-type strap cell in the first row comprises a P-type well strap structure, and the P-type well strap structure is configured to electrically connect a P-type well of the first-type strap cell with a first voltage connector electrically coupled with the first voltage line; and
a plurality of second-type strap cells arranged in a second row different from the first row substantially parallel to the at least one read word line portion of the SRAM cells or the at least one write word line portion of the SRAM cells or at least one other read word line portion of the SRAM cells or at least one other write word line portion of the SRAM cells, wherein each second-type strap cell in the second row comprises an N-type well strap structure, and the N-type well strap structure is configured to electrically connect an N-type well of the second-type strap cell with a second voltage connector electrically coupled with the second voltage line,
wherein the first row is free of second-type strap cells and the second row is free of first-type strap cells, and
wherein each column of SRAM cells of the columns of SRAM cells is bracketed by one first-type strap cell of the plurality of first-type strap cells or one second-type strap cell of the plurality of second-type strap cells.

12. The two-port SRAM array of claim 11, wherein
the SRAM cells of the plurality of SRAM cells are divided into a first sub-array having a first set of SRAM cells of the plurality of SRAM cells and a second sub-array having a second set of SRAM cells of the plurality of SRAM cells,
the first sub-array abuts the second sub-array,
the write bit line portions of the SRAM cells of the first sub-array arranged in at least one first column of the first sub-array are electrically connected with the write bit line portions of the SRAM cells of the second sub-array arranged in at least one second column of the second sub-array,
the complementary write bit line portions of the SRAM cells of the first sub-array arranged in the at least one first column are electrically connected with the complementary write bit line portions of the SRAM cells of the second sub-array arranged in the at least one second column, and
the read bit line portions of the SRAM cells of the first sub-array arranged in the at least one first column are physically separated from the read bit line portions of the SRAM cells of the second sub-array arranged in the at least one second column.

13. The two-port SRAM array of claim 11, wherein the read bit line portion of the SRAM cells of the first sub-array are configured to be electrically connected to a first sense amplifier and the read bit line portion of the SRAM cells of the second sub-array are configured to be electrically connected to a second sense amplifier different from the first sense amplifier.

14. The two-port SRAM array of claim 11, wherein the write bit line portion, the complementary write bit line portion and the read bit line portion of each SRAM cell of the plurality of SRAM cells are in a first layer on a first level, and the write word line portion and the read word line portion of each SRAM cell of the plurality of SRAM cells are in a second layer on a second level different from the first level.

15. The two-port SRAM array of claim 11, wherein the SRAM cells of the plurality of SRAM cells have a cell pitch in the first direction less than about 0.135 micrometers and a maximum distance between a first-type strap cell in a first column of SRAM cells of the plurality of SRAM cells and a second-type strap cell is less than about 33 micrometers.

16. The two-port SRAM array of claim 15, wherein at least one of each first-type strap cell of the plurality of first-type strap cells or each second-type strap cell of the plurality of second-type strap cells has a cell height in the first direction equal to about three times the cell pitch.

17. The two-port SRAM array of claim 11, wherein at least one of each first-type strap cell of the plurality of first-type strap cells or each second-type strap cell of the plurality of second-type strap cells comprise one or more dummy gate electrodes.

18. A two-port static-random access memory (SRAM) array, comprising:
a plurality of SRAM cells arranged in columns and rows, the columns of SRAM cells are arranged in a first direction, the rows of SRAM cells are arranged in a second direction different from the first direction, each SRAM cell of the plurality of SRAM cells comprises:
a write bit line portion extending in the first direction, the write bit line portion is coupled with a write bit line portion of an adjacent SRAM cell;
a complementary write bit line portion extending in the first direction, the complementary write bit line portion is coupled with a complementary write bit line portion of the adjacent SRAM cell;
a read bit line portion extending m the first direction, the read bit line portion is coupled with a read bit line portion of the adjacent SRAM cell;
a write word line portion extending in the second direction, the write word line portion is coupled with a write word line portion of another adjacent SRAM cell;
a read word line portion extending in the second direction, the read word line portion is coupled with a read word line portion of the another adjacent SRAM cell;
at least one connection to a first voltage line; and
at least one connection to a second voltage line;

a plurality of first-type strap cells arranged in first a row substantially parallel to at least one of the read word line portions of the SRAM cells or at least one of the write word line portions of the SRAM cells, wherein each first-type strap cell in the first row comprises a P-type well strap structure, and the P-type well strap structure is configured to electrically connect a P-type well of the first-type strap cell with a first voltage connector electrically coupled with the first voltage line; and a plurality of second-type strap cells arranged in a second row different from the first row substantially parallel to the at least one read word line portion of the SRAM cells or the at least one write word line portion or at least one other read word line portion of the SRAM cells or at least one other write word line portion of the SRAM cells, wherein each second-type strap cell in the second row comprises an N-type well strap structure, and the N-type well strap structure is configured to electrically connect an N-type well of the second-type strap cell with a second voltage connector electrically coupled with the second voltage line, wherein the first row is free of second-type strap cells and the second row is free of first-type strap cells, wherein each column of SRAM cells is bracketed by one first-type strap cell of the plurality of first-type strap cells or one second-type strap cell of the plurality of second-type strap cells the SRAM cells of the plurality of SRAM cells are divided into a first sub-array having a first set of SRAM cells of the plurality of SRAM cells, a second sub-array having a second set of SRAM cells of the plurality of SRAM cells, a third sub-array having a third set of SRAM cells of the plurality of SRAM cells, and a fourth sub-array having a fourth set of SRAM cells of the plurality of SRAM cells, the first sub-array abuts the second sub-array, the third sub-array abuts the fourth sub-array, the write bit line portions of the SRAM cells of the first sub-array arranged in the at least one first column are electrically connected with the write bit line portions of the SRAM cells of the second sub-array arranged in the at least one second column, the complementary write bit line portions of the SRAM cells of the first sub-array arranged in the at least one first column are electrically connected with the complementary write bit line portions of the SRAM cells of the second sub-array arranged in the at least one second column, the write bit line portions of the SRAM cells of the third sub-array arranged in the at least one third column are electrically connected with the write bit line portions of the SRAM cells of the fourth sub-array arranged in the at least one fourth column, the complementary write bit line portions of the SRAM cells of the third sub-array arranged in the at least one third column are electrically connected with the complementary write bit line portions of the SRAM cells of the fourth sub-array arranged in the at least one fourth column, the read bit line portions of the SRAM cells of the first sub-array arranged in the at least one first column are physically separated from the read bit line portions of the SRAM cells of the second sub-array arranged in the at least one second column, and the read bit line portions of the SRAM cells of the third sub-array arranged in the at least one third column are physically separated from the read bit line portions of the SRAM cells of the fourth sub-array arranged in the at least one fourth column.

19. The SRAM array of claim 18, wherein the read bit line portions of the SRAM cells of the first sub-array are configured to be electrically connected to a first sense amplifier, the read bit line portions of the SRAM cells of the second sub-array are configured to be electrically connected to a second sense amplifier different from the first sense amplifier, the read bit line portions of the SRAM cells of the third sub-array are configured to be electrically connected to the second sense amplifier, and the read bit line portions of the SRAM cells of the fourth sub-array are configured to be electrically connected to a third sense amplifier different from the first sense amplifier and the second sense amplifier.

20. The SRAM array of claim 19, wherein a first row of strap cells is between the SRAM cells of the first sub-array and the first sense amplifier, a second row of strap cells is between the SRAM cells of the second sub-array and the second sense amplifier, a third row of strap cells is between the SRAM cells of the third sub-array and the second sense amplifier, and a fourth row of strap cells is between the SRAM cells of the fourth sub-array and the third sense amplifier.

* * * * *